United States Patent
Murade

(10) Patent No.: US 6,953,949 B2
(45) Date of Patent: Oct. 11, 2005

(54) ELECTRO-OPTICAL DEVICE AND ELECTRONIC APPARATUS

(75) Inventor: Masao Murade, Suwa (JP)

(73) Assignee: Seiko Epson Corporation, Tokyo (JP)

(*) Notice: Subject to any disclaimer, the term of this patent is extended or adjusted under 35 U.S.C. 154(b) by 283 days.

(21) Appl. No.: 10/441,020

(22) Filed: May 20, 2003

(65) Prior Publication Data

US 2003/0234971 A1 Dec. 25, 2003

(30) Foreign Application Priority Data

May 21, 2002 (JP) ........................................ 2002-146432
May 21, 2002 (JP) ........................................ 2002-146433

(51) Int. Cl.⁷ ............................................. H01L 29/04
(52) U.S. Cl. ......................... 257/59; 257/72; 257/294; 257/457; 257/749
(58) Field of Search .......................... 257/59, 72, 294, 257/449–457, 749

(56) References Cited

U.S. PATENT DOCUMENTS

| | | | |
|---|---|---|---|
| 5,644,147 A | * | 7/1997 | Yamazaki et al. ............ 257/66 |
| 5,668,379 A | * | 9/1997 | Ono et al. ..................... 257/59 |
| 2001/0013909 A1 | | 8/2001 | Zhang et al. |
| 2002/0018278 A1 | | 2/2002 | Sato |

FOREIGN PATENT DOCUMENTS

| | | |
|---|---|---|
| JP | A 5-257164 | 10/1993 |
| JP | A 8-234239 | 9/1996 |
| JP | A 9-26601 | 1/1997 |
| JP | A 9-325367 | 12/1997 |
| JP | A 2001-330832 | 11/2001 |
| JP | A 2002-90721 | 3/2002 |
| JP | A 2002-124679 | 4/2002 |
| WO | WO99/47972 | 9/1999 |

* cited by examiner

*Primary Examiner*—Andy Huynh
(74) *Attorney, Agent, or Firm*—Oliff & Berridge, PLC

(57) ABSTRACT

An electro-optical device according to the present invention includes, above a substrate, pixel electrodes, thin film transistors connected to the pixel electrodes, an upper light shielding film to cover the upper side of the channel regions of the thin film transistors, and a lower light shielding film to cover the lower side of the channel regions of the thin film transistors. Each of the upper light shielding film and the lower light shielding film has projecting portions to define corner cuts in an opening region of each pixel, in the intersection regions where data lines and scanning lines intersect each other. Both projecting portions are connected to each other through contact holes. The channel region of the thin film transistors are disposed in the intersection regions.

51 Claims, 17 Drawing Sheets

ELECTRO-OPTICAL DEVICE AND ELECTRONIC APPARATUS

BACKGROUND OF THE INVENTION

1. Field of Invention

The present invention relates to an active matrix drive type electro-optical device and an electronic apparatus. Specifically, the invention relates to an electro-optical device having pixel-switching thin film transistors (hereinafter "TFTs") within a stacked structure, on a substrate and an electronic apparatus, such as a projector, that includes such an electro-optical device.

2. Description of Related Art

In electro-optical devices, such as TFT active matrix drive type liquid crystal devices, EL (Electro-luminescence) display devices and the like, when the incident light is irradiated to a channel region of a pixel-switching TFT provided in each pixel, a light leakage current results from excitation by the light to vary characteristics of the TFT. Specifically, in case of electro-optical devices for a light valve of projectors, since intensity of the incident light is high, it is important to shield the channel region or its adjacent region of the TFT from the incident light.

Therefore, in the related art, in each pixel provided on the counter substrate, by use of a light shielding film to define an opening region reflecting or transmitting the light to be contribute to the a display or by use of data lines extending over a TFT and being made of metal film, such as aluminum (Al), such channel region or its adjacent region is shielded from light. Further, the light shielding film made of, for example, high melting-point metal may be also provided below the pixel-switching TFT on the TFT array substrate. If the light shielding film is also provided below the TFT like above, it is possible to previously prevent the light from entering the TFT of the electro-optical device, where the light may be the back-reflected light from the TFT array substrate side or the return light, such as the projected light which is passed through a prism from other electro-optical device, when a plurality of electro-optical devices are combined through prism to constitute an optical system.

The various light shielding technologies described above are subject to the following problems.

First, according to the technology of forming the light shielding film on the counter substrate or the TFT array substrate, since the light shielding film and the channel region are separated considerably apart from each other through, for example, a liquid crystal layer, an electrode, an interlayer insulating film and the like as viewed three dimensionally, it is not sufficient to prevent the light from entering obliquely between both. Specifically, in a small sized electro-optical device used as light valve of projector, the incident light is a light beam condensing the light from a light source through a lens, and unnegligibly or not insignificantly contains components to be obliquely irradiated. For example, since the incident light may contain 10% of components oblique by 10° to 15° from a direction perpendicular to the substrate, it creates a problem in practice that such oblique incident light is not blocked sufficiently.

Further, the light entering the electro-optical device through a region not having the light shielding film may be reflected from the upper face of the substrate or the light shielding film formed on the substrate or the data line, and then such a reflected light or the multiple reflected light may reach finally the channel region of the TFT. The multiple reflected light is generated by re-reflecting the reflected light from the substrate, the light shielding film or the data line.

Specifically, in order to accomplish the high accuracy of the electro-optical device or the minuteness of pixel pitch due to a recent general requirement of high quality of the displayed image, as the intensity of the incident light is increased to display a brighter image, problems occur, such as it is more difficult to perform the sufficient light shielding by use of the aforementioned related light shielding technologies and the flicker phenomena may be generated due to gradation of the transistor characteristics of TFT, thereby deteriorating quality of the displayed image.

Furthermore, although it may be considered that an area to form the light shielding film should be simply made to be greater in order to increase the lightproof property, there is a problem that it is basically difficult to increase the aperture ratio of each pixel only by use of it and thus the displayed image becomes dark.

SUMMARY OF THE INVENTION

The present invention address the above and/or other problems, and provides an electro-optical device excellent in lightproof and capable of displaying a bright and high-quality image and an electronic apparatus including such an electro-optical device.

In order to address or solve the above, a first electro-optical device of the present invention includes: above a substrate, pixel electrodes; thin film transistors to switch and control the pixel electrodes; data lines to supply image signals to the thin film transistors; scanning lines to supply scanning signals to the thin film transistors, the scanning lines intersecting the data lines; an upper light shielding film to cover the upper side of channel regions and/or regions adjacent to the channel regions of a semiconductor layer constituting the thin film transistors; and a lower light shielding film to cover the lower side of the channel regions and/or the adjacent regions. Each of the upper light shielding film and the lower light shielding film has projecting portions projected to define corner cuts in an opening region of each pixel corresponding to the pixel electrode, in intersection regions where the data line and the scanning line intersect each other. The channel regions are disposed in the intersection regions. The upper light shielding film and the lower light shielding film are connected to each other through a light shielding conductive material or directly in the projecting portions.

According to the first electro-optical device of the present invention, in operation thereof, for example, the image signal is supplied to a source of the thin film transistor via the data line and the scanning signal is supplied to a gate of the thin film transistor via the scanning line. Then, for example, by switching and controlling the pixel electrode connected to a drain of the thin film transistor through the thin film transistor, it is possible to drive the first electro-optical device in an active matrix drive way. In addition, since the upper side of the channel regions and/or the adjacent regions of the semiconductor layer constituting the thin film transistors is covered with the upper light shielding film, it is possible to basically prevent or substantially prevent the incident light entering from the substrate surface from entering the channel region and the adjacent region of the thin film transistor. Furthermore, since the lower side of the channel region and the adjacent region of the thin film transistor is covered with the lower light shielding film, it is possible to basically prevent or substantially prevent the return light from the bottom face of the substrate from entering the channel region and the adjacent region of the thin film transistor. The "return light" means a light not to contribute to display and returning in a direction opposite to the incident light, such as a light reflected from the back surface of the substrate or a light emitted from other light valve in a multiple plate type projector using a plurality of first electro-optical devices as light valves and passing through a synthesized optical system.

Each of the upper light shielding film and the lower light shielding film has specifically projecting portions projected to define the corner cut in the opening region of each pixel in the intersection region in which the data line and the scanning line intersect each other. For example, considering a rectangular opening region as a reference, one to four corner cuts are implemented to define a pentagonal to octagonal opening region. Further, the channel regions are disposed in the intersection regions having such corner cuts. Therefore, compared with a case that such projecting portion does not exist, the intensive incident light traveling vertically or obliquely from the top face of the substrate and the inner reflected light and multiple reflected light on the basis of the intensive incident light or the return light traveling vertically or obliquely from the bottom face of the substrate and the inner reflected light and multiple reflected light on the basis of the return light can be prevented or substantially prevented more effectively from entering the channel region and its adjacent region of the thin film transistor, through the upper light shielding film and the lower light shielding film having the projecting portions, respectively.

Furthermore, according to the present invention, the upper light shielding film and the lower light shielding film are connected to each other in the projecting portions through the light shielding conductive material or directly. For this reason, the channel region and its adjacent region disposed in the intersection region are partially surrounded from their sides by the mutually connected portion of the upper light shielding film and the lower light shielding film. That is, the light shielding performance to the incident light or the return light to enter obliquely from their sides with a relatively great slope can be remarkably enhanced by the mutually connected portion surrounded from the side.

Furthermore, since the upper light shielding film and the lower light shielding film are connected to each other, the potential of the both films can be equal and in addition, it is possible, for example, to use one of both light shielding films as a wire while using the other of both light shielding films as a redundant wire thereof.

As a result, through the three-dimensional light shielding of surrounding in the horizontal direction and in the vertical direction by the upper light shielding film and the lower light shielding film connected to each other, it is possible to efficiently reduce the display irregularity or flicker due to generation of the light leakage current in the thin film transistor or deviation thereof, while enhancing the aperture ratio of each pixel so that a bright and high-quality image can be displayed finally. In addition, it is possible to realize the redundant wire by use of the upper light shielding film and the lower light shielding film connected to each other and it is possible to further reduce the flicker, etc., by accomplishing a lower resistance of the capacitor line, etc.

In one exemplary embodiment of the first electro-optical device of the present invention, the upper light shielding film and the lower light shielding film are connected to each other through contact holes, and the upper light shielding films or plug made of the conductive material is disposed in the contact holes.

According to this exemplary embodiment, it is possible to preferably and electrically connect the upper light shielding film and the lower light shielding film to each other through the contact holes. Further, the channel region and its adjacent region can be partially surrounded from their sides by the upper light shielding film or the light shielding conductive material constituting the plug, which is disposed in the contact hole provided in the projecting portions.

Further, in another exemplary embodiment of the first electro-optical device of the present invention, the upper light shielding film and the lower light shielding film are connected to each other through a penetrating groove having a cross-sectional shape corresponding to a profile of the projecting portions, and, a partition, which is made of the upper light shielding film or the light shielding conductive material, is formed within the penetrating groove, the partition facing the channel region from the side.

According to this exemplary embodiment, it is possible to electrically and finely connect the upper light shielding film and the lower light shielding film to each other through the penetrating groove. Further, the channel region and its adjacent region can be partially and more broadly surrounded by the partition from their sides. The partition is made of the upper light shielding film or the light shielding conductive material in the penetrating groove having a cross-sectional shape corresponding to a profile of the projecting portions. The cross-sectional shape of the penetrating groove may be, for example, almost identical to or a little smaller than the profile of the projecting portions, or a little greater than the profile of the projecting portions. Here, as the penetrating groove is formed more greatly, its light shielding performance is more enhanced.

In another exemplary embodiment of the first electro-optical device of the present invention, each of the four corners of the intersection region is provided with the projecting portions, and the upper light shielding film and the lower light shielding film are connected to each other at each of the four corners.

According to this exemplary embodiment, the channel region and its adjacent region can be surrounded from all sides by the upper light shielding film or the light shielding conductive material, which is disposed within the contact holes or the penetrating grooves provided in the projecting portions, so that the light shielding performance can be surely enhanced.

In order to address or solve the above, a second electro-optical device of the present invention includes: above a substrate, pixel electrodes; thin film transistors to switch and control the pixel electrode; data lines to supply image signals to the thin film transistors; scanning lines to supply scanning signals to the thin film transistors, the scanning lines intersecting the data lines; an upper light shielding film to cover the upper side of channel regions and/or regions adjacent to the channel region of a semiconductor layer constituting the thin film transistors; and a lower light shielding film to cover the lower side of the channel regions and/or the adjacent regions. Each of the upper light shielding film and the lower light shielding film has projecting portions projected to define corner cuts in an opening region of each pixel corresponding to the pixel electrode, in intersection regions where the data line and the scanning line intersect each other. The channel regions are disposed in the intersection regions. The scanning line is made of the lower light shielding film. The lower light shielding film is connected to a gate electrode film of the thin film transistor through a light shielding conductive material or connected directly to the gate electrode film of the thin film transistor, in the projecting portions.

According to the second electro-optical device of the present invention, it is possible to drive the second electro-optical device in the same active matrix drive way as that of the above first electro-optical device. In addition, since the upper side of the channel regions and/or the adjacent regions of the semiconductor layer constituting the thin film transistors is covered with the upper light shielding film, it is possible to basically prevent or substantially prevent the incident light input from the top face of the substrate from entering the channel region and the adjacent region of the thin film transistor. Furthermore, since the lower side of the channel region and the adjacent region of the thin film transistor is covered with the lower light shielding film, it is possible to basically prevent or substantially prevent the return light input from the bottom face of the substrate from entering the channel region and the adjacent region.

Here, specifically, each of the upper light shielding film and the lower light shielding film has projecting portions projected to define the corner cut in the opening region of each pixel in the intersection region in which the data line and the scanning line intersect each other. Further, the channel regions are disposed in the intersection regions having such corner cut. Therefore, it is possible to effectively prevent or substantially prevent from entering the channel region and its adjacent region of the thin film transistor, the incident light and the return light and the inner reflected light and multiple reflected light due to the incident light and the return light, through the upper light shielding film and the lower light shielding film having the projecting portions, respectively.

Furthermore, according to the present invention, the scanning line is made of the lower light shielding film and in addition, the lower light shielding film is connected to the gate electrode film through the light shielding conductive material or connected directly to the gate electrode film in the projecting portions. For this reason, the channel region and its adjacent region disposed in the intersection region are partially surrounded from their sides by the portion in which the lower light shielding film and the gate electrode film are connected to each other. That is, the light shielding performance to the incident light or the return light to enter obliquely from the side with a relatively great slope can be remarkably enhanced by the mutually connected portion surrounded from sides like above.

Furthermore, the stacked structure above the substrate and the manufacturing processes can be simplified by using the lower light shielding film for the scanning line.

As a result, through the three-dimensional light shielding of surrounding the lower and upper sides of the channel region and its adjacent region by the upper light shielding film and the lower light shielding film and surrounding the right and left sides of the channel region and its adjacent region by the mutually connected portion of the lower light shielding film and the gate electrode film while improving the aperture ratio of each pixel, it is possible to efficiently reduce the display irregularity or flicker due to generation of the light leakage current in the thin film transistor or deviation thereof, so that a bright and high-quality image can be displayed finally.

In one exemplary embodiment of the second electro-optical device of the present invention, the lower light shielding film and the gate electrode film are connected to each other through contact holes, and the gate electrode film or plugs made of the light shielding conductive material is disposed in the contact holes.

According to this exemplary embodiment, it is possible to preferably and electrically connect the lower light shielding film and the gate electrode film to each other through the contact holes. Further, the channel region and its adjacent region can be partially surrounded by the gate electrode film or the light shielding conductive material constituting the plugs disposed in the contact holes provided in the projecting portions from their sides.

In another exemplary embodiment of the second electro-optical device of the present invention, the lower light shielding film and the gate electrode film are connected to each other through a penetrating groove having a cross-sectional shape corresponding to a profile of the projecting portion, and a partition, which is made of the gate electrode film or the light shielding conductive material, is formed within the penetrating groove, the partition facing the channel region from the side.

According to this exemplary embodiment, it is possible to electrically and preferably connect the lower light shielding film and the gate electrode film to each other through the penetrating groove. Further, the channel region and its adjacent region can be partially and more broadly surrounded from their sides by the partition made of the gate electrode film or the light shielding conductive material in the penetrating groove having a cross-sectional shape corresponding to the profile of the projecting portion.

In another exemplary embodiment of the second electro-optical device of the present invention, each of the four corners of the intersection region is provided with the projecting portions, and the lower light shielding film and the gate electrode film are connected to each other at each of the four corners.

According to this exemplary embodiment, the channel region and its adjacent region are surrounded from all sides by the gate electrode film or the light shielding conductive material disposed within the contact holes or the penetrating grooves provided in the projecting portions, so that the light shielding performance can be surely enhanced.

In another exemplary embodiment of the second electro-optical device of the present invention, the gate electrode film extends along the scanning line and is made of a part of other scanning line constituting redundant wires of the scanning line.

According to this exemplary embodiment, by using the redundant structure including the scanning line made of the light shielding film and other scanning line comprised of the gate electrode film, the resistance of the scanning line can be lowered. Further, even when the scanning line is partially disconnected, it is possible to effectively prevent or substantially prevent it from coming to the fore as a defect.

In another exemplary embodiment of the first or second electro-optical device of the present invention, the channel region is disposed at a center of the intersection region.

In this exemplary embodiment, the channel region is disposed at the center of the intersection region and is separated from the opening region of each pixel transmitting the light specifically as much as the corner cut. For this reason, it is possible to efficiently enhance the light shielding performance to the channel region. Furthermore, "the channel region is disposed at the center of the intersection region" means when the channel region is disposed to be biased toward the center from the edge in the intersection region as well as when the center point of the channel region is disposed to be identical to the center point of the intersection region.

In another exemplary embodiment of the first or second electro-optical device of the present invention, the first or second electro-optical device further includes storage capacitors electrically connected to the pixel electrode and the upper light shielding film functions both as a fixed-potential-side capacitor electrode constituting the storage capacitor and a capacitor line including the fixed-potential-side capacitor electrode.

According to this exemplary embodiment, the potential written in the pixel electrode through the thin film transistor can be maintained for a longer time compared with the writing time by using the storage capacitor. In addition, since the upper light shielding film functions both as the fixed-potential-side capacitor electrode constituting the storage capacitor and the capacitor line, the stacked structure above the substrate and the manufacturing processes can be simplified, compared to the case of manufacturing both separately. Such upper light shielding film may be made of a conductive light shielding film, such as metal films, alloy films, metal silicide films and the like.

However, when the storage capacitor is manufactured in the present invention, the upper light shielding film may function as the pixel potential side capacitor electrode of the storage capacitor. In addition, both of the fixed-potential-side capacitor electrode and the pixel potential side capacitor electrode may be made of the conductive light shielding film. Furthermore, these capacitor electrodes may be disposed one above the other on the substrate and vice versa.

In another exemplary embodiment of the first or second electro-optical device of the present invention, the projecting portion is formed in a plane region separated from the data line, and the storage capacitor is also formed in a plane region overlapping the data line.

According to this exemplary embodiment, since the storage capacitor can be manufactured by effectively using the lower portion of the data line except the projecting portion in which the upper light shielding film and the lower light shielding film are connected to each other, the storage capacitor can be expanded in the limited light shielding region.

In another exemplary embodiment of the first or second electro-optical device of the present invention, the projecting portion of the upper light shielding film is a little greater than the projecting portion of the lower light shielding film.

According to this exemplary embodiment, the incident light more intensive than the normal return light passes by the upper light shielding film and is reflected from the surface of the lower light shielding film to prevent or substantially prevent effectively from generating the inner reflected light.

In order to address or solve the above, a third electro-optical device of the present invention includes: above a substrate, pixel electrodes; thin film transistors to switch and control the pixel electrodes; data lines to supply image signals to the thin film transistors; scanning lines to supply scanning signals to the thin film transistor, the scanning lines intersecting the data line; and an upper light shielding film to cover the upper side of channel regions and/or regions adjacent to the channel region of a semiconductor layer constituting the thin film transistors, and defining at least partially a lattice-shaped light shielding region along the data line and the scanning line. The upper light shielding film has projecting portions projected to define corner cuts in an opening region of each pixel corresponding to the pixel electrode, in intersection regions where the data line and the scanning line intersect each other. The channel regions are disposed in the intersection regions.

According to the third electro-optical device of the present invention, in operation thereof, for example, the image signal is supplied to a source of the thin film transistor via the data line and the scanning signal is supplied to a gate of the thin film transistor via the scanning line. Then, for example, by switching and controlling the pixel electrode connected to a drain of the thin film transistor through the thin film transistor, it is possible to drive the third electro-optical device in an active matrix drive way. In addition, since the upper side of the channel regions and/or the adjacent regions of the semiconductor layer constituting the thin film transistors is covered with the upper light shielding film, it is possible to basically prevent or substantially prevent the incident light input from the top face of the substrate from entering the channel region and the adjacent region of the thin film transistor.

The upper light shielding film has specifically projecting portions projected to define the corner cut in the opening region of each pixel in the intersection region in which the data line and the scanning line intersect each other. For example, considering a rectangular opening region as a reference, one to four corner cuts are implemented to define a pentagonal to octagonal opening region. Further, the channel regions are disposed in the intersection regions having such corner cuts. Therefore, compared with a case that such projecting portion does not exist, it is possible to effectively prevent or substantially prevent from entering the channel region and the adjacent region of the thin film transistor, the intensive incident light traveling vertically or obliquely from the top face of the substrate and the inner reflected light and multiple reflected light on the basis of the incident light, by using the upper light shielding film having the projecting portion.

Further, since the upper light shielding film defines at least partially the lattice-shaped light shielding region, it is possible to define the non-opened region of each pixel with an excellent accuracy by using the upper light shielding film.

As a result, while enhancing the aperture ratio of each pixel, it is possible to efficiently reduce the display irregularity or flicker due to generation of the light leakage current in the thin film transistor or deviation thereof, so that a bright and high-quality image can be displayed finally.

In one exemplary embodiment of the third electro-optical device of the present invention, the pixel electrode has a plane shape whose corners are cut off correspondingly to the corner cut.

According to this exemplary embodiment, the corner cut is also implemented to the pixel electrode, and the plane shape is, for example, pentagonal to octagonal, etc. On the other hand, the pixel electrode of the electro-optical device is generally formed by patterning, for example, an ITO (Indium Tin Oxide) film. Therefore, since a little film residual generates due to the resist residual in patterning, it is preferable that a certain gap is formed between the adjacent pixel electrodes. The reason is that an electrical short circuit may be generated between the adjacent pixel electrodes. In addition, such film residual more easily generates in a region in which large stepped portion or unevenness is formed on a base thereof. Nevertheless, in the electro-optical device, the stepped portion or the unevenness becomes large on the base exactly in the intersection region in which the scanning line and the data line are stacked. Therefore, in this exemplary embodiment, in order to basically and locally reduce the film residual in the intersection region in which the film residual is easily generated, the pixel electrode having the plane shape whose corresponding corner is cut off is formed in the intersection region. That is, a short circuit is hard to be generated between the pixel electrodes in patterning because of such plane shape. By doing so, it is possible to reduce the gap between the pixel electrodes adjacent each other in a part of the light shielding region separated from the intersection region along the data line or in a part of the light shielding region along the scanning line, without generation of the short circuit between both pixel electrodes. Therefore, it is possible to accomplish the minuteness of the pixel pitch and to promote high accuracy of the displayed image basically required in this art by reducing the gap between the pixel electrodes without lowering yield.

In another exemplary embodiment of the third electro-optical device of the present invention, the channel region is disposed at a center of the intersection region.

In this exemplary embodiment, the channel region is disposed at the center of the intersection region and is separated from the opening region of each pixel transmitting the light specifically as much as the corner cut. For this reason, it is possible to efficiently enhance the light shielding performance to the channel region. Furthermore, "the channel region is disposed at the center of the intersection region" means when the channel region is disposed to be biased a little toward the center from the edge in the intersection region as well as when the center point of the channel region is disposed to be identical to the center point of the intersection region.

In another exemplary embodiment of the third electro-optical device of the present invention, the third electro-optical device further includes storage capacitors electrically connected to the pixel electrode, and the upper light shielding film functions both as a fixed-potential-side capacitor electrode constituting the storage capacitor and a capacitor line including the fixed-potential-side capacitor electrode.

According to this exemplary embodiment, the potential written in the pixel electrode through the thin film transistor can be maintained for a longer time compared with the writing time by using the storage capacitor. In addition, since the upper light shielding film functions both as the fixed-potential-side capacitor electrode constituting the storage capacitor and the capacitor line, the stacked structure above the substrate and the manufacturing processes can be simplified, compared to the case of manufacturing both separately. Such upper light shielding film may be made of a conductive light shielding film, such as metal films, alloy films, metal silicide films and the like.

However, when the storage capacitor is manufactured in the present invention, the upper light shielding film may also function as the pixel potential side capacitor electrode of the storage capacitor. In addition, both of the fixed-potential-side capacitor electrode and the pixel potential side capacitor electrode may be made of the conductive light shielding film. Furthermore, these capacitor electrodes may be disposed one above the other on the substrate and vice versa.

In addition, in another exemplary embodiment of the third electro-optical device of the present invention, the third electro-optical device further comprises storage capacitors electrically connected to the pixel electrode, and the storage capacitor is formed in the light shielding region and in addition, is formed in a region overlapping the projecting portion.

According to this exemplary embodiment, since the storage capacitor can be manufactured by effectively using the lower portion of the projecting portion projected toward the opening region of each pixel, the storage capacitor can be expanded in the limited light shielding region.

In another exemplary embodiment of the third electro-optical device of the present invention, the third electro-optical device further includes a lower light shielding film to cover the lower side of the channel regions and/or the adjacent regions, and to define at least partially the lattice-shaped light shielding region.

According to this exemplary embodiment, since the lower side of the channel regions and/or the adjacent regions of the semiconductor layer constituting the thin film transistors are covered with the lower light shielding film, it is possible to basically prevent or substantially prevent the return light from the bottom face of the substrate and the inner reflected light or multiple reflected light on the basis of the return light from entering the channel region and the adjacent region of the thin film transistor. Here, the "return light" means a light not contributing to the display and returning in a direction opposite to the direction of the incident light, such as a light reflected from the back surface of the substrate or a light emitted from other light valve in a multiple plate type projector using a plurality of electro-optical devices as light valves and passing through a synthesized optical system.

Furthermore, since the lower light shielding film defines at least partially the lattice-shaped light shielding region, it is possible to define the non-opened region of each pixel with an excellent accuracy by using the upper light shielding film and the lower light shielding film formed on the same substrate.

In another exemplary embodiment of the third electro-optical device of the present invention, the lower light shielding film has projecting portions projected to define the corner cut in the intersection region.

According to this exemplary embodiment, similarly to the upper light shielding film, the lower light shielding film has the projecting portion to define the corner cut in the intersection region. Therefore, compared to a case that such projecting portion does not exist, it is possible to more effectively prevent or substantially prevent from entering the channel region and its adjacent region of the thin film transistor, the return light traveling vertically or obliquely from the bottom face of the substrate and the inner reflected light and multiple reflected light on the basis of the return light, by using the lower light shielding film having the projecting portion.

In this exemplary embodiment, the plan or shape of the lower light shielding film may be formed to be a little smaller in the intersection region than the plane shape of the upper light shielding film.

By doing so, the incident light having a higher intensity than the normal return light passes by the upper light shielding film and is reflected from the surface of the lower light shielding film to prevent effectively or prevent substantially from generating the inner reflected light.

In order to address or solve the above, a fourth electro-optical device of the present invention includes: above a substrate, pixel electrodes; thin film transistors to switch and control the pixel electrodes; data lines to supply image signals to the thin film transistors; scanning lines to supply scanning signals to the thin film transistor, the scanning lines intersecting the data lines; and a lower light shielding film to cover the lower side of channel regions and/or regions adjacent to the channel region of a semiconductor layer constituting the thin film transistors, and defining at least partially a lattice-shaped light shielding region along the data line and the scanning line. The lower light shielding film has projecting portions projected to define corner cuts in an opening region of each pixel corresponding to the pixel electrode, in intersection regions where the data line and the scanning line intersect each other. The channel regions are disposed in the intersection regions.

According to the fourth electro-optical device of the present invention, the lower light shielding film has the projecting portion projected to define the corner cut in the opening region of each pixel in the intersection region. Therefore, compared with a case that such projecting portion does not exist, the return light traveling vertically or obliquely from the bottom face of the substrate and the inner reflected light and multiple reflected light on the basis of the return light, can be prevented effectively or prevented substantially from entering the channel region and its adjacent region of the thin film transistor by using the lower light shielding film having the projecting portion.

Further, since the lower light shielding film defines at least partially the lattice-shaped light shielding region, it is possible to define the non-opened region of each pixel with an excellent accuracy by using the lower light shielding film.

As a result, while enhancing the aperture ratio of each pixel, it is possible to efficiently reduce the display irregularity or flicker due to generation of the light leakage current in the thin film transistor or deviation thereof, so that a bright and high-quality image can be displayed finally.

In one exemplary embodiment of the fourth electro-optical device of the present invention, the lower light shielding film is made of a light shielding conductive film, is connected to the scanning line at a plurality of positions, extends along the scanning line and serves as a redundant wire of the scanning line.

According to this exemplary embodiment, since the lower light shielding film made of the conductive light shielding film serves as the redundant wire of the scanning line, it is possible to accomplish the low resistance of the scanning line, that is, the width of a formation region of the scanning line or a part of the light shielding region along the scanning line can be reduced. Therefore, it is possible to display a brighter and higher quality image.

In another exemplary embodiment of the first, second, third or fourth electro-optical device of the present invention, the first, second third or fourth electro-optical device further includes a counter substrate disposed opposite to the substrate, with an electro-optical material layer therebetween, and among the four corners of the opening region, at least one corner in which operation failure in the electro-optical material layer is relatively large are provided with the projecting portion.

According to this exemplary embodiment, corners in which the operation failure of the electro-optical material layer, for example, such as the orientation defect of liquid crystal layer is large, define the corner cuts. Therefore, when the operation failure does not occur uniformly in the four corners such as, for example, when the orientation defect of the liquid crystal layer does not occur uniformly in the four corners through the relationship with the rubbing direction, the region in which the operation failure occurs is hidden actively. Accordingly, through prevention of the light leakage in the corners of each opening region etc, the contrast ratio can increase efficiently. In addition, since in the corners in which the operation failure is little, the normal operation or the operation very close to the normal operation is performed, it is possible to reduce or suppress deterioration of the aperture ratio of each pixel due to existence of the projecting portion, by using such corners as a part of the opening region without hiding such corners.

Furthermore, such projecting portion may be provided in one position, two positions or three positions for one opening region in accordance with the positions in or the extent to which the operation failure occurs.

In another exemplary embodiment of the first, second, third or fourth electro-optical device of the present invention, the pixel electrode includes a first pixel electrode group to be inversely driven at a first period and a second pixel electrode group to be inversely driven at a second period complementary to the first period and is disposed in plane on the substrate, and the projecting portions are provided in two corners located on the first pixel electrode group side or in two corners located on the second pixel electrode group side from a center of the intersection region.

According to this exemplary embodiment, in operation thereof, both of (i) the pixel electrodes adjacent each other to be driven with driving voltages having inverse polarities at each time in inversely driving, and (ii) the pixel electrodes adjacent each other to be driven with driving voltages having the same polarity at each time in inversely driving exist. Both pixel electrodes exist in the first and second electro-optical device, such as the matrix drive type liquid crystal device employing, for example, the 1H inverse drive type in which the polarity of the driving voltage is inversed in a field unit every row or the 1S inverse drive type in which the polarity of the driving voltage is inversed in a field unit every column. Therefore, the horizontal electric field is generated between the pixel electrodes adjacent each other belonging to the pixel electrode groups different from each other. Nevertheless, in this exemplary embodiment, the two corners located on the first pixel electrode group side or the two corners located on the second pixel electrode group side from the center of the intersection region are provided with the corner cut. For this reason, it is possible to shield from light the region in which the horizontal electric field is generated in the vicinity of the intersection region by using the projecting portion and it is also possible to effectively prevent or substantially prevent the bad influence due to the horizontal electric field from coming to the fore or appearing remarkably. As a result, it is possible to display a high-contrast, bright and high-quality image.

In another exemplary embodiment of the first, second, third or fourth electro-optical device of the present invention, each of the four corners of the opening region is provided with projecting portions symmetrical both in horizontal direction and in the vertical direction.

According to this exemplary embodiment, since each of the four corners of the opening region is provided with the projecting portion symmetrical both in the horizontal direction and in the vertical direction, the plane shape of the opening region of each pixel is close to a circular shape or a polygonal shape, compared to a case that the projecting portion does not exist. As a result, it is possible to display a fine image in which the light leakage region or the operation failure region is reduced in each opening region, by using the opening region having the plane shape close to the circular shape or the polygonal shape. Specifically, when the micro lens having a circular shape or close to the circular shape is used, since the incident light properly condensed can be transmitted through the opening region and the incident light not properly condensed can be blocked, by employing the aforementioned construction, it is very effective.

In another exemplary embodiment of the first, second, third or fourth electro-optical device of the present invention, the first, second, third or fourth electro-optical device further includes micro lenses disposed opposite to the pixel electrode on the substrate or on a counter substrate opposite to the substrate.

According to this exemplary embodiment, the incident light is derived closely to the center of the opening region of each pixel through the micro lens. The incident light properly condensed through the micro lens to contribute to the display hardly reaches the projecting portion of the upper light shielding film to define the corner cut in the intersection region. Therefore, since the light components not properly condensed through the micro lens can be blocked by using the projecting portion, it is possible to accomplish the enhancement of image quality while the brightness is maintained.

Further, the aforementioned first or second electro-optical device of the present invention, for example, may be implemented as a liquid crystal device or may be implemented as an EL display device.

In another exemplary embodiment of the first or second electro-optical device of the present invention, the upper light shielding film defines at least partially a lattice-shaped light shielding region along the data line and the scanning line.

According to this exemplary embodiment, it is possible to define the non-opened region of each pixel with a fine accuracy by using the upper light shielding film. Specifically, compared with a case that the non-opened region is defined by using the light shielding film on the counter substrate side, since the aperture ratio can be prevented from being lowered due to deviation in bonding both substrates and the thin film transistor can be shielded from light by being close to the thin film transistor, the first or second electro optical device is very advantageous.

Furthermore, the lower light shielding film may be constructed to define at least partially the lattice-shaped light shielding region along the data line and the scanning line.

In another exemplary embodiment of the third or fourth electro-optical device of the present invention, a drain electrode of the thin film transistor is disposed in a region overlapping the projecting portion when seen in a plan view.

According to this exemplary embodiment, it is possible to provide the drain electrode of the thin film transistor by using the light shielding region overlapping the projecting portion as viewed in a plan view, and it is possible not to reduce the opening region of each pixel due to existence of the drain electrode.

Furthermore, the aforementioned electro-optical device of the present invention, for example, may be implemented as the liquid crystal device and may be implemented as the EL display device.

In order to address or solve the above, an electronic apparatus of the present invention includes the first, second, third or fourth electro-optical device (further including various exemplary embodiments thereof) of the present invention.

Since the electronic apparatus of the present invention includes the above first, second, third or fourth electro-optical device, it is possible to realize various electronic apparatuses capable of displaying a bright and high quality image, such as a projection type display unit, a liquid crystal television, a mobile phone, an electronic pocket book, a word processor, a view finder type or monitor direct view-type video tape recorder, a work station, a television phone, a POS terminal, a touch panel, and the like, for example.

The above operations and other advantages of the present invention will become more apparent from the exemplary embodiments described below.

DETAILED DESCRIPTION OF PREFERRED EXEMPLARY EMBODIMENTS

Exemplary embodiments of the present invention are described below in detail with reference to the drawings. In the following exemplary embodiments, an electro-optical device of the present invention applies to a liquid crystal device.

(First Exemplary Embodiment)

Figure 1:
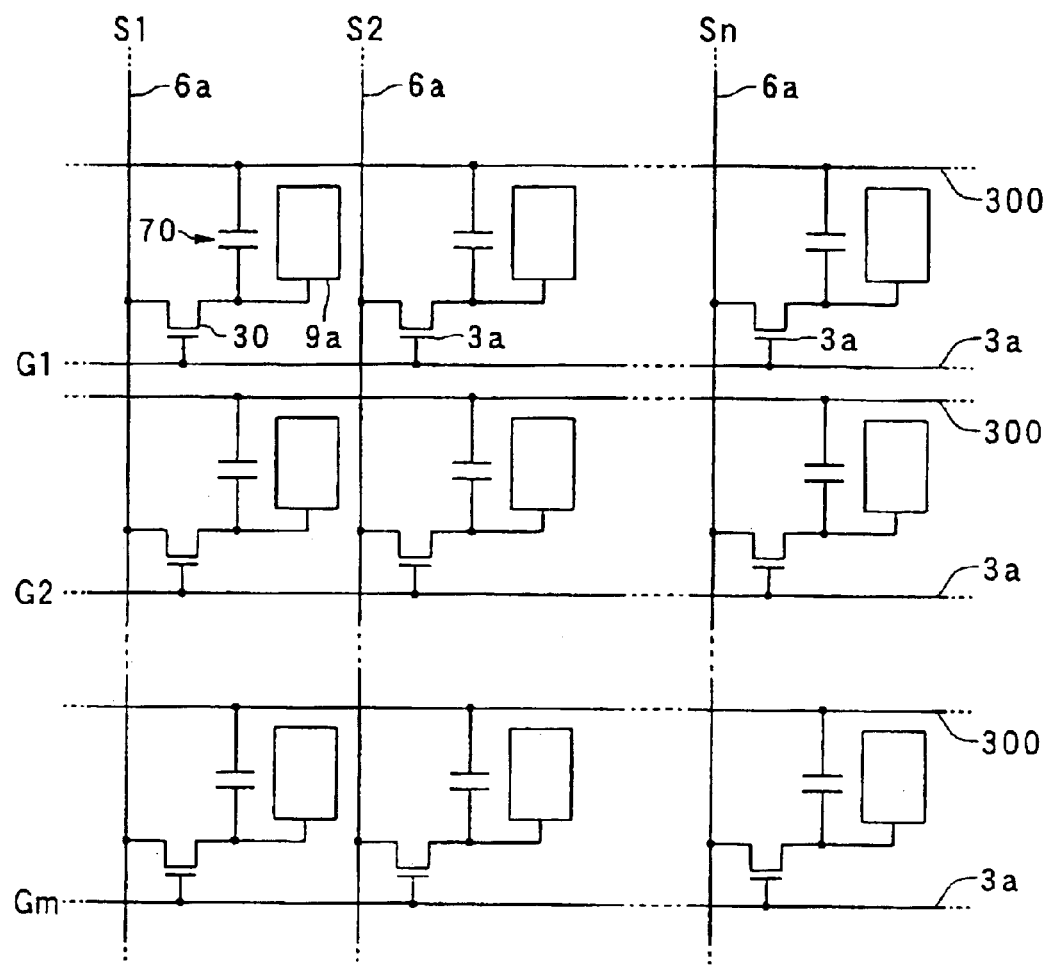
FIG. 1 is a schematic illustrating an equivalent circuit of various types of elements, wires and the like disposed at a plurality of matrix shaped pixels constituting an image display region in an electro-optical device of an exemplary embodiment of the present invention.
Figure 2:
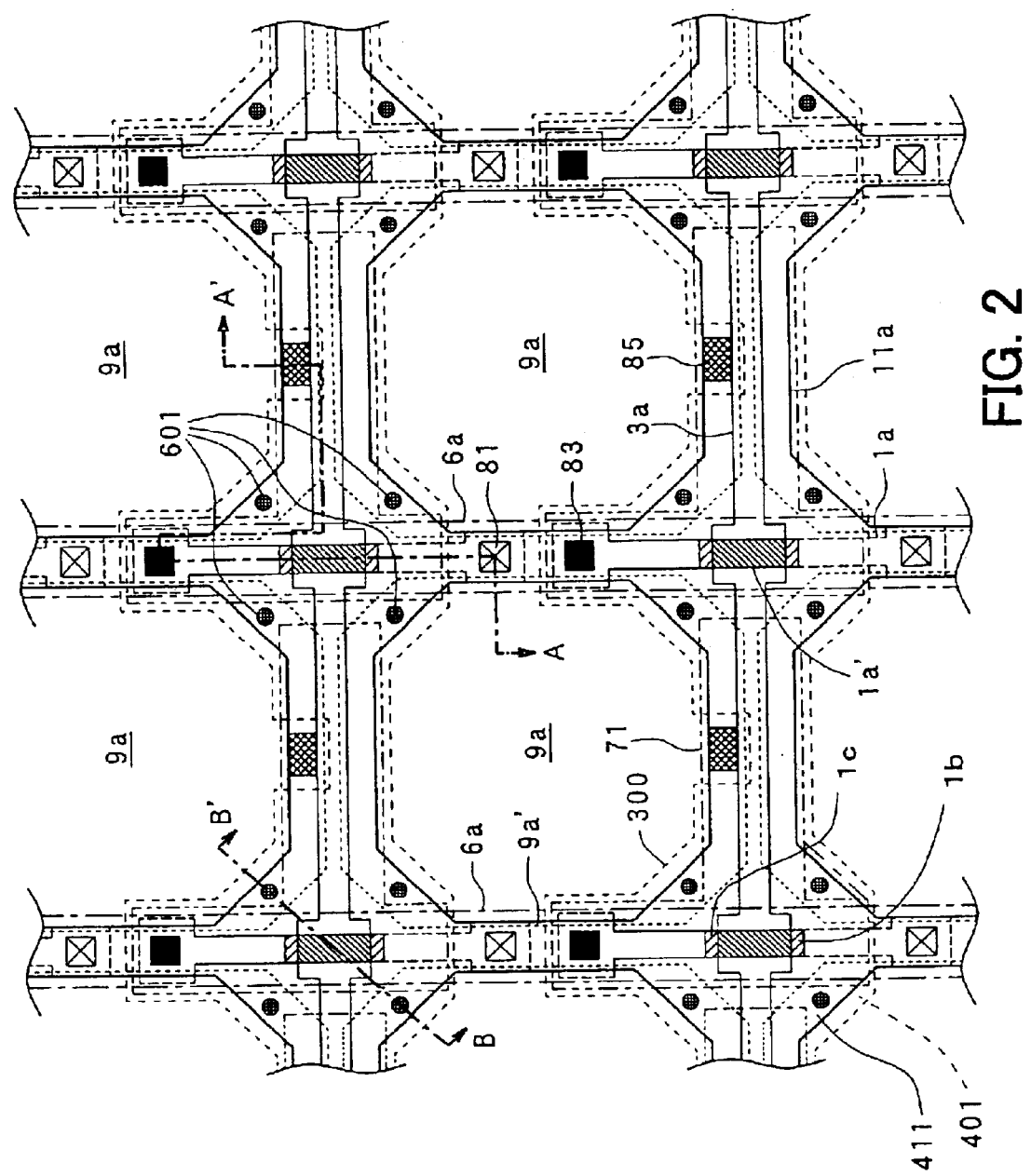
FIG. 2 is a plan view illustrating a plurality of pixel groups which are adjacent each other in a TFT array substrate on which data lines, scanning lines, pixel electrodes, and the like in an electro-optical device of the first exemplary embodiment of the present invention are formed.
Figure 3:
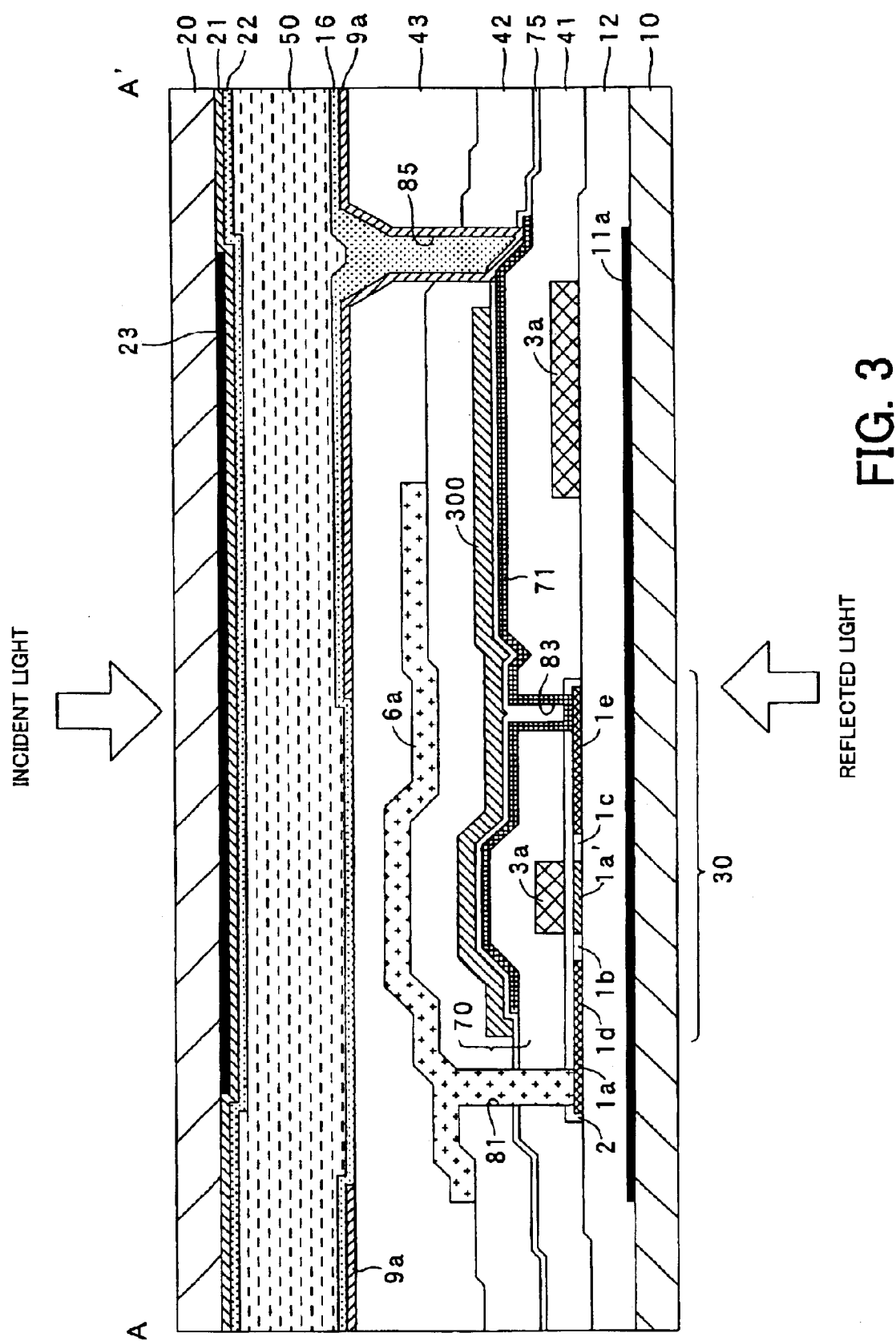
FIG. 3 is a cross-sectional view taken along plane A–A' of FIG. 2.
Figure 4:
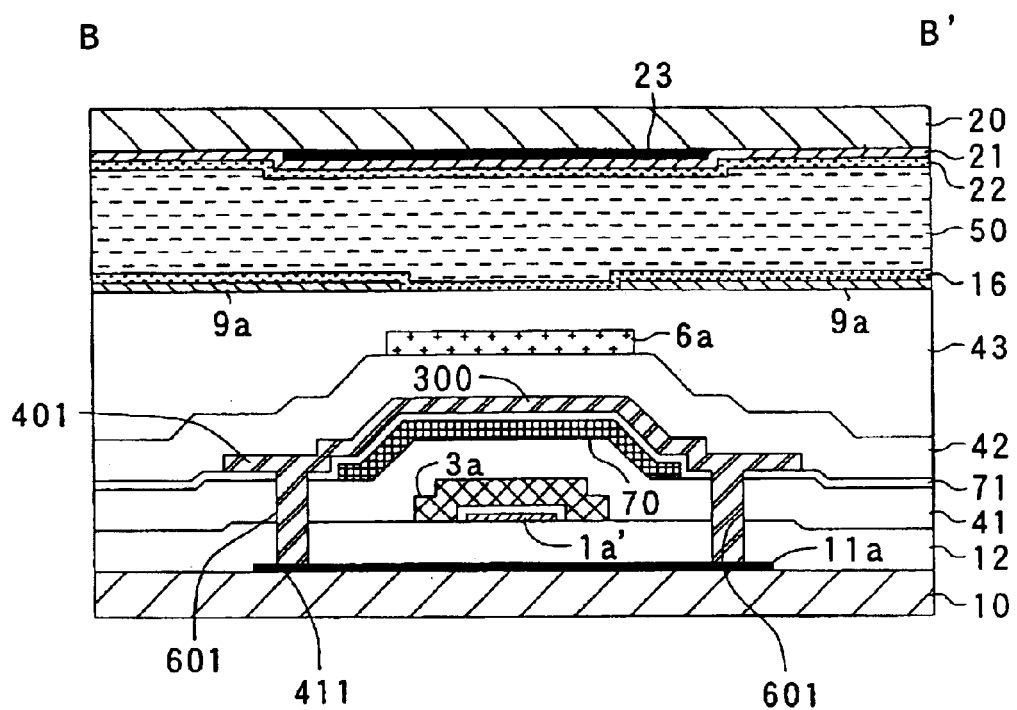
FIG. 4 is a cross-sectional view taken along plane B–B' of FIG. 2.

First, the construction of a pixel portion of an electro-optical device according to a first exemplary embodiment of the present invention is described with reference to FIGS. 1 to 4. FIG. 1 is a schematic illustrating an equivalent circuit of various types of elements, wires and the like disposed at a plurality of matrix shaped pixels constituting an image display region in the electro-optical device. FIG. 2 is a plan view illustrating a plurality of pixel groups which are adjacent each other in a TFT array substrate on which data lines, scanning lines, pixel electrodes and the like are formed. FIG. 3 is a cross-sectional view taken along plane A–A' of FIG. 2, and FIG. 4 is a cross-sectional view taken along plane B–B' of FIG. 2. Since each layer or each element in FIGS. 3 and 4 is illustrated in recognizable size in the drawings, each layer or each element is illustrated in different scales.

In FIG. 1, a plurality of pixels constituting the image display region of the electro-optical device according to the present exemplary embodiment is formed in a matrix, each pixel comprises pixel electrodes 9a and a TFT 30 to switch and control the pixel electrode 9a, and data lines 6a to which image signals are input are electrically connected to a source of the TFT 30. The image signals S1, S2, . . . and Sn which are written to the data lines 6a may be provided line-sequentially in the this order, and otherwise may be provided every group in which a plurality of data lines 6a being adjacent each other are grouped. In addition, a gate of the TFT 30 is electrically connected to scanning lines 3a, and scanning signals G1, G2, . . . and Gm are applied line-sequentially as pulses to the scanning line 3a in the this order at a predetermined timing. The pixel electrode 9a is electrically connected to a drain of the TFT 30 to switch off the TFT 30 which is a switching device for only a predetermined period, thereby writing the image signals S1, S2, . . . and Sn provided from the data line 6a at a predetermined timing. The image signals S1, S2, . . . and Sn written in a predetermined levels in a liquid crystal, which is an example of an electro-optical material, through the pixel electrode 9a are held during a predetermined period between the pixel electrode and a counter electrode (described below) formed on a counter substrate (described below). The orientation or order of the molecular group in the liquid crystal is changed according to the level of the applied voltage to modulate light so that a gray scale can be displayed. In normally white mode, the transmittance to the incident light is reduced in accordance with the voltage applied in unit of pixel and in normally black mode, the transmittance to the incident light is increased in accordance with the voltage applied in unit of pixel so that light having contrast in accordance with the image signals is emitted perfectly from the electro-optical device. In order to reduce or avoid leakage of the held image signal, storage capacitors 70 are provided parallel with a liquid crystal capacitor formed between the pixel electrode 9a and the counter substrate. The storage capacitor 70 is formed between a drain region of the TFT 30 and a capacitor line 300.

In FIG. 2, a plurality of transparent pixel electrodes 9a (their profiles are illustrated with dotted portions 9a') are provided in a matrix on the TFT array substrate of the electro-optical device, and the data lines 6a and the scanning lines 3a are provided along the longitudinal and transverse boundaries of the pixel electrodes 9a.

In addition, on a semiconductor layer 1a, the scanning line 3a is disposed opposite to the channel region 1a' shown with fine oblique lines drawn in the vertical direction on the drawing, and the scanning line 3a serves as a gate electrode. In particular, the scanning line 3a is widely formed on the portion which should be the gate electrode in the exemplary embodiment. In the same manner, the TFT 30 to provide pixel switching, on which the scanning line 3a is arranged oppositely to each channel region 1a' as a gate electrode, is provided at each of the intersection positions of the scanning line 3a and the data line 6a.

As shown in FIGS. 2 and 3, the capacitor lines 300 are formed on the scanning line 3a. The capacitor line 300 includes a main line portion which expends in a stripe shape along the scanning line 3a when seen in a plan view, and projecting portions which projects along the data line 6a from the main line portion at the intersectional position of the scanning line 3a and the data line 6a upward and downward on FIG. 2.

The capacitor line 300 includes a conductive light shielding film including, for example, metal or alloy, and serves as a fixed-potential-side capacitor electrode which is an example of the upper light shielding film. The capacitor line 300 is made of a single-element metal, an alloy, a metal silicide, a poly-silicide or one stacked with the aforementioned including at least one of high melting-point metals, for example, Ti (titanium), Cr (chromium), W (tungsten), Ta (tantalum), Mo (molybdenum) and the like. The capacitor line 300 may further includes other metals, such as Al (aluminum), Ag (silver), Au (gold), Cu (copper). In addition, the capacitor line 300 may have a multi-layered structure in which a first film made of, for example, a conductive polysilicon film and the like and a second film made of, for example, a metal silicide film including a high melting-point metal and the like are stacked.

On the other hand, a relay layer 71, which is disposed opposite to the capacitor line 300 through a dielectric film 75, serves as a pixel potential side capacitor electrode of the storage capacitor 70 as well as an intermediate conductive layer interconnecting the pixel electrode 9a and a highly doped drain region 1e of the TFT 30.

In such a manner, the relay layer 71 as a pixel potential side capacitor electrode connected to the highly doped drain region 1e of the TFT 30 and the pixel electrode 9a and some portion of the capacitor line 300 as a fixed-potential-side capacitor electrode are disposed opposite to each other through a dielectric film 75 to construct the storage capacitor 70 of the exemplary embodiment.

The data line 6a which extends in a longitudinal direction in FIG. 2 and the capacitor line 300 which extends in a transverse direction in FIG. 2 are formed to intersect each other so that upper light shielding film having a lattice shape when seen in a plan view can be formed on the upper side of the TFT 30 above the TFT array substrate 10 to define an opening region of each pixel.

On the other hand, a lower light shielding film 11a is provided having a lattice shape on lower side of the TFT 30 on the TFT array substrate 10. The lower light shielding film 11a is also formed of various types of metal films similar to the capacitor line 300.

In the exemplary embodiment, the capacitor line 360 particularly includes projecting portions 401 to define corner cuts in the opening region of each pixel at the intersection region of the scanning line 3a and the data line 6a in the lattice-shaped light shielding region. In addition, the lower light shielding film 11a also includes projecting portions 411 to define corner cuts in the opening region of each pixel at the intersection region, corresponding to the projecting portion 401 to define the corner cuts. The construction, operation and effect for the projecting portions 401 and 411 is described below with reference to FIG. 4.

Furthermore, in FIG. 3, the dielectric film 75 disposed between the capacitor line 300 and the relay layer 71 as a capacitor electrode 71 is made of, for example, a silicon nitride film or a relatively thin silicon oxide film of HTO film, LTO film or the like having a film thickness of about 5 to 200 nm. In view of increasing the capacitance of the storage capacitor 70, the thinner dielectric film 75 is the better as far as its reliability is sufficiently obtained.

As shown in FIGS. 2 and 3, the pixel electrode 9a is electrically connected to the highly doped drain region 1e of the semiconductor layer 1a though contact holes 83 and 85 by interconnecting the relay layer 71. In case that such a relay layer 71 is used as a relay layer, although the distance between layers is long, for example, about 2000 nm, it is possible to reduce or avoid the technical difficulty in connecting the layers with one contact hole and also to properly connect the layers with two or more contact holes having relatively small diameters in series. Therefore, it is possible to enhance the aperture ratio of pixel, and to advantageously prevent or substantially prevent punch-out etching during the opening process for the contact holes.

On the other hand, the data line 6a is electrically connected to the highly doped source region 1d of the semiconductor 1a made of, for example, polysilicon film though contact hole 81. Furthermore, the data line 6a and the highly doped source region 1a may be also interconnected by a relay layer.

The capacitor line 300 is extended around the image display region on which the pixel electrode 9a is disposed and is electrically connected to a constant potential source, thereby being a fixed potential. Such a constant potential source may be a constant potential source of a positive or negative power source which is supplied to scanning lines driving circuit (described below) to supply scanning signals to scanning lines 3a in order to drive the TFT 30 or data lines driving circuit (described below) controlling a sampling circuit to supply image signals to the data line 6a, and it may be a constant potential which is supplied to the counter electrode 21 of the counter substrate 20.

In the exemplary embodiment, the lower light shielding film 11a and the capacitor line 300 having such a construction are connected each other through a contact hole 601, and the lower light shielding film 11a serves as a redundant wire of the capacitor line 300. By doing so, it is possible to reduce the resistance of the capacitor line 300, and it is possible to avoid failure of the whole device due to partial failure or disconnection of the capacitor line 300. The construction, operation and effect according to the contact hole 601 is described below with reference to FIG. 4.

Furthermore, it is possible to drop the voltage of the lower light shielding film 11a to a fixed voltage by connecting with the capacitor line 300. For this reason, it is possible to avoid a bad or negative influence of the potential variation of the lower light shielding film 11a on the TFT 30.

In FIGS. 2 and 3, the electro-optical device comprises a transparent TFT array substrate 10 and a transparent counter substrate 20 disposed opposite to the substrate 10. The TFT array substrate 10 is made of, for example, a quartz substrate, a glass substrate, or a silicon substrate and the counter substrate 20 is made of, for example, a glass substrate or a quartz substrate.

As shown in FIG. 3, the TFT array substrate 10 is provided with the pixel electrode 9a, on which an oriented film 16 performed with a predetermined orientation process, such as a rubbing process is disposed on the pixel electrode 9a. The pixel electrode 9a is made of a transparent conductive film, for example, such as ITO (Indium Tin Oxide) film and the like. The oriented film 16 is also made of organic film, such as polyimide film and the like.

On the other hand, the counter electrode 21 is provided on the entire front surface of the counter substrate 20, and the oriented film 22 performed with a predetermined orientation process, such as a rubbing process is provided below the counter electrode 21. The counter electrode 21 is made of a transparent conductive film, for example, such as ITO film and the like. The oriented film 22 is made of an organic film, such as polyimide film and the like.

As constructed above, between the TFT array substrate 10 and the counter substrate 20 where the pixel electrode 9a and the counter electrode 21 are disposed opposite to each other, the liquid crystal which is an example of an electro-optical material is sealed into space surrounded by a sealing member described below, thereby forming a liquid crystal layer 50. The liquid crystal layer 50 takes a predetermined orientation state with no electric field from the pixel electrode 9a applied to it. The liquid crystal layer 50 comprises one kind of nematic liquid crystal or mixture of several kinds of nematic liquid crystals. The sealing member is a adherent made of, for example, photo-curing resin or thermo-setting resin which bonds the peripherals of the TFT array substrate 10 and the counter substrate 20, and gap materials, such as glass fiber or glass beads are mixed into the sealing member in order to keep the distance between the substrates at a predetermined value.

In addition, an underlying insulating film 12 is provided below the pixel switching TFT 30. The underlying insulating film 12 has a function of interlayer-insulating the TFT 30 from the lower light shielding film 11a and in addition, since it is formed on the whole surface of the TFT array substrate 10, the underlying insulating film 12 also has a function of preventing or substantially preventing variation in characteristics of the pixel switching TFT 30 due to the roughness created in the polishing process of the surface of the TFT array substrate 10 or the contaminated material remaining after the cleaning process or the like.

In FIG. 3, the pixel switching TFT 30 has a LDD (Lightly Doped Drain) structure, and includes scanning lines 3a, a channel region 1a' of the semiconductor layer 1a where a channel is formed with the electric field from the scanning line 3a, an insulating film 2 including a gate insulating film to insulate the scanning line 3a and the semiconductor layer 1a, a lightly doped source region 1b and a lightly doped drain region 1c of the semiconductor layer 1a, and a highly doped source region 1d and a highly doped drain region 1e of the semiconductor layer 1a.

A first interlayer insulating film 41 where a contact hole 81 passing through the highly doped source region 1d and a contact hole 83 passing through the highly doped drain region 1e are opened is provided on the scanning line 3a.

A relay layer 71 and a capacitor line 300 are formed on the first interlayer insulating film 41, and then a second interlayer insulating film 42 in which a contact hole 81 and a contact hole 85 are opened, respectively is formed on the capacitor line 300.

Data lines 6a is formed on the second interlayer insulating film 42 and then, a third interlayer insulating film 43 in which the contact hole 85 passing through the relay layer 71 is provided is formed on the data line 6a. And then, the pixel electrode 9a is formed on a top face of the third interlayer insulating film 43 thus constructed.

The construction of the projecting portion 401 of the capacitor line 300, the projecting portion 411 of the lower light shielding film 11a, and the contact hole 601 are described below with reference to FIG. 4.

In FIG. 4, the projecting portion 401 and the projecting portion 411 are interconnected through the contact hole 601. In addition, the contact hole 601 is filled with the aforementioned various metal materials or the like having the light shielding property which constitute the capacitor line 300 similar to the projecting portion 401. For this reason, as shown in FIGS. 2 and 4, the channel region 1a' and the adjacent regions are constructed to be surrounded by the contact hole 601 filled with light shielding materials at four sides of the lateral portions of the regions. The channel region 1a' and the adjacent regions are constructed to be surrounded vertically with the capacitor line 300 including the projecting portion 401 and the light shielding film 11a including the projecting portion 411.

As described above with reference to FIGS. 1 to 4, in accordance to the exemplary embodiment, the upper sides of the channel region 1a' and the adjacent regions (that is, the lightly doped source region 1b and the lightly doped drain region 1c in FIGS. 2 and 3, respectively) are covered with the data line 6a and the capacitor line 300 which constitute an upper light shielding film. Therefore, the light shielding to the incident light from the direction perpendicular to the TFT array substrate 10 can be enhanced by the data line 6a and the capacitor line 300 which constitute an upper light shielding film. On the other hand, the lower sides of the channel region 1a' and the adjacent regions are covered with the lower light shielding film 11a. Therefore, the light shielding to such return light as a light reflected from the back surface of the TFT array substrate 10 or a light being emitted from other electro-optical devices of the multiple plate type projector where a plurality of electro-optical devices are used as light valves and passing through a synthetic optical system can be enhanced by the lower light shielding film 11a.

The incident light includes an oblique light which enters the TFT array substrate 10 obliquely. For example, the incident light may have about 10% of components with the incident angle deviated by about 10° to 15° from the right angle. In addition, such an oblique light is reflected on the upper surface of the lower light shielding film 11a formed on the TFT array substrate 10, thereby creating an oblique inner reflected light in the aforementioned electro-optical device. Furthermore, such an oblique inner reflected light is reflected on the other boundary surfaces of the aforementioned electro-optical device, thereby creating an oblique multi-reflected light. In particular, since the incident light has still more intensity than the return light, the oblique inner reflected light or the multi-reflected light derived from such an incident light has also high intensity. Furthermore, since the return light has a light entering obliquely, the inner reflected light or multi-reflected light derived from the return light is also created.

However, in this exemplary embodiment, the capacitor line 300 particularly has the projecting portion 401 to define the corner cuts at the opening region in each pixel at the intersection region (see FIG. 2). In the same manner, the lower light shielding film 11a has the projecting portion 411 to define the corner cuts at the opening region in each pixel at the intersection region (see FIG. 2). In addition, the channel region 1a' is disposed at the center of the intersection region, and is separated from the opening region of each pixel which the incident light passes through or the return light enters, as much as the portion in which the corner cuts exists. For this reason, the light shielding performance to the channel region 1a' and the adjacent regions is remarkably increased with the presence of the projecting portions 401 and 411. That is, compared to the case that the projecting portions 401 and 411 do not exist, it is possible to effectively prevent or substantially prevent the intensive incident light or the return light traveling obliquely and the inner reflected light or the multi-reflected light derived from the incident and return lights from entering the channel region 1a' and the adjacent regions.

Furthermore, in this exemplary embodiment, as shown in FIGS. 2 and 4, the channel region 1a' and the adjacent regions are surrounded by the contact hole 601 filled with a light shielding material at the side surfaces of the regions. For this reason, the light shielding performance to the incident light or the return light entering obliquely having relatively high oblique angle at the side surfaces of the regions is remarkably increased by use of the contact hole 601 filled with a light shielding conductive material.

In this case, it is preferable that the upper projecting portion 401 is a little larger than the lower projecting portion 411. By doing so, since the incident light having a higher intensity than the normal return light passes by the upper projecting portion 401 and is reflected on the inner surface of the lower projecting portion 411, it is possible to effectively prevent or substantially prevent the inner reflected light from being created.

Furthermore, in the exemplary embodiment, since the lower light shielding film 11a is particularly used as a redundant wire of the capacitor line 300, the resistance of the capacitor line 300 can be reduced.

As described above with reference to FIGS. 1 to 4, according to the exemplary embodiment, since the pixel switching TFT 30 has excellent transistor characteristics, the display irregularity, flicker, and the like can be reduced, thereby obtaining an electro-optical device which is able to perform an image display with high brightness, high accuracy and high quality.

On the other hand, as shown in FIG. 4, in the exemplary embodiment, although the contact hole 601 is filled with the same material as the capacitor line 300 which is an upper light shielding film, a plug may be formed in the contact hole 601 with other conductive materials having light shielding property.

Furthermore, in the exemplary embodiment, as shown in FIG. 2, the projecting portions 401 and 411 which are symmetrical in vertical and horizontal directions at four corners of the opening region are provided. Therefore, the plane shape of the opening region of each pixel is approximately circular or polygonal in comparison with the case that the projecting portions 401 and 411 do not exist. By doing so, since light shielding can be performed to balance at the four sides of the TFT 30, it is possible to perform excellent image display with the light leakage region or the operational failure region in each of the opening regions being reduced.

In particular, in case that micro lenses for condensing the incident light of each opening region having an approximately circular shape is provided on the side of the counter substrate 20 or the TFT array substrate 10 of the electro-optical device, it is advantageous to cut off the four corners of the opening region of each pixel and to approximate a circular shape in relation with the shape of the condensed light. More particularly, if the micro lens is provided, the incident light is guided into the central portion of the opening region of each of the pixel through the micro lens. Here, since the incident light properly condensed by the micro lens to contribute to the display is condensed, it rarely reaches the projecting portions 401 and 411. Therefore, the component of the light which is not properly condensed by the micro lens can be shielded by the projecting portions 401 and 411. In particular, the portion opposite to the intersection region out of the boundaries of the micro lens which is adjacent each other to be in an array shape has a poor condensing characteristic in view of properties of the lens. Therefore, since the presence of the projecting portions 401 and 411 to enhance the light shielding region locally in the vicinity of the intersection region, is very significant from the view point that the light passing through the portion of the micro lens having the poor condensing characteristic can be blocked and in other words, the portion of the micro lens having the poor condensing characteristic can be hidden.

However, in the exemplary embodiment, the projecting portions may be provided to one corner, two or three corners among the four corners of the opening region of each of the pixel. Furthermore, in the exemplary embodiment, the contact holes may be provided to one corner, two or three corners among the four corners of the opening region of each of the pixel. In any case, it is possible to enhance the corresponding light shielding performance in comparison with the case that the projecting portions or contact holes are not provided.

In particular, the projecting portion 401 or 411 may be provided at one corner or a plurality of corners of the four corners, the alignment failure of which in the liquid crystal layer 50 is relatively large, instead of providing the projecting portions 401 and 411 in all the four corners. For example, the projecting portion 401 or the projecting portion 411 may be provided only in the corner, the alignment failure of which in the liquid crystal layer 50 occurs most remarkably in relation with the rubbing direction on the oriented films 16 and 22. By doing so, since the excessive extension of the non-opening region can be reduced or suppressed and the alignment failure of the liquid crystal layer 50 can be hidden, it is possible to effectively increase the contrast ratio.

Further, when the inversed drive type such as the 1H inverse drive type in which the polarity of the driving voltage is inversed in a field unit every row or the 1S inverse drive type in which the polarity of the driving voltage is inversed in a field unit every column is employed, the horizontal electric field is generated between the pixel electrodes adjacent each other belonging to different pixel electrode groups (that is, the pixel electrodes adjacent each other to which voltages having the inversed polarity are applied). In this case, all of the four corners of each pixel are not provided with the projecting portions 401 and 411, but the region in which the horizontal electric field is generated in the vicinity of the intersection region may be provided with the projecting portions and the light may be blocked by them, so that the bad or negative influence due to the horizontal electric field may be prevented or substantially prevented from coming to the fore or appearing remarkably.

In the exemplary embodiment described above, as shown in FIGS. 3 and 4, the light shielding film 23 may be further formed in a lattice shape or a stripe shape in a region other than the opening region of each pixel on the counter substrate 20. By employing such construction, as described above, it is possible to more surely prevent or substantially prevent the incident light from the counter substrate 20 from entering the channel region 1a' and its adjacent region by use of the light shielding film 23 on the counter substrate 20 side along with the capacitor line 300 and the data line 6a constituting the upper light shielding film. Further, by making out of a high reflective film at least the surface of the light shielding film 23 on the counter substrate side to which the incident light is irradiated, it is possible to prevent or substantially prevent increase in temperature of the electro-optical device. Furthermore, it is preferable that the light shielding film on the counter substrate 20 side is formed to be located within the light shielding layer including the capacitor line 300 and the data line 6a as viewed in a plan view. Accordingly, by use of the light shielding film on the counter substrate 20 side, it is possible to obtain an effect of blocking light and an effect of reducing or suppressing increase in temperature without lowering the aperture ratio of each pixel.

In the exemplary embodiment described above, the projecting portions 401 and 411 are formed in a plane region separated from the data line 6a and the storage capacitor 70 is further formed in a plan or region overlapping the data line 6a. For this reason, by effectively using the lower portion of the data line 6a, it is possible to accomplish expansion of the storage capacitor 70.

In the exemplary embodiment described above, the stepped portion generated in the region along the data line 6a or the scanning line 3a on the base surface of the pixel electrode 9a may be planarized by forming a groove in the TFT array substrate 10 or forming a groove in the underlying insulating film 12, the first interlayer insulating film 41, the second interlayer insulating film 42 and the third interlayer insulating film 43 and then burying the wire such as the data line 6a, the TFT 30 or the like. In addition, by polishing the stepped portion above the third interlayer insulating film 43 or the second interlayer insulating film 42 through the CMP (Chemical Mechanical Polishing) process, etc., or by forming it flat using the organic SOG (Spin On Glass), the aforementioned planarization process may be carried out.

Furthermore, since it is preferable that the contact hole 601 is opened to be, for example, about 1 μm in diameter, the stepped portion due to the contact hole 601 almost disappears in the base surface of the pixel electrode 9a due to existence of the second interlayer insulating film 42 and the third interlayer insulating film 43 on the contact hole.

(Second Exemplary Embodiment)

Figure 5:
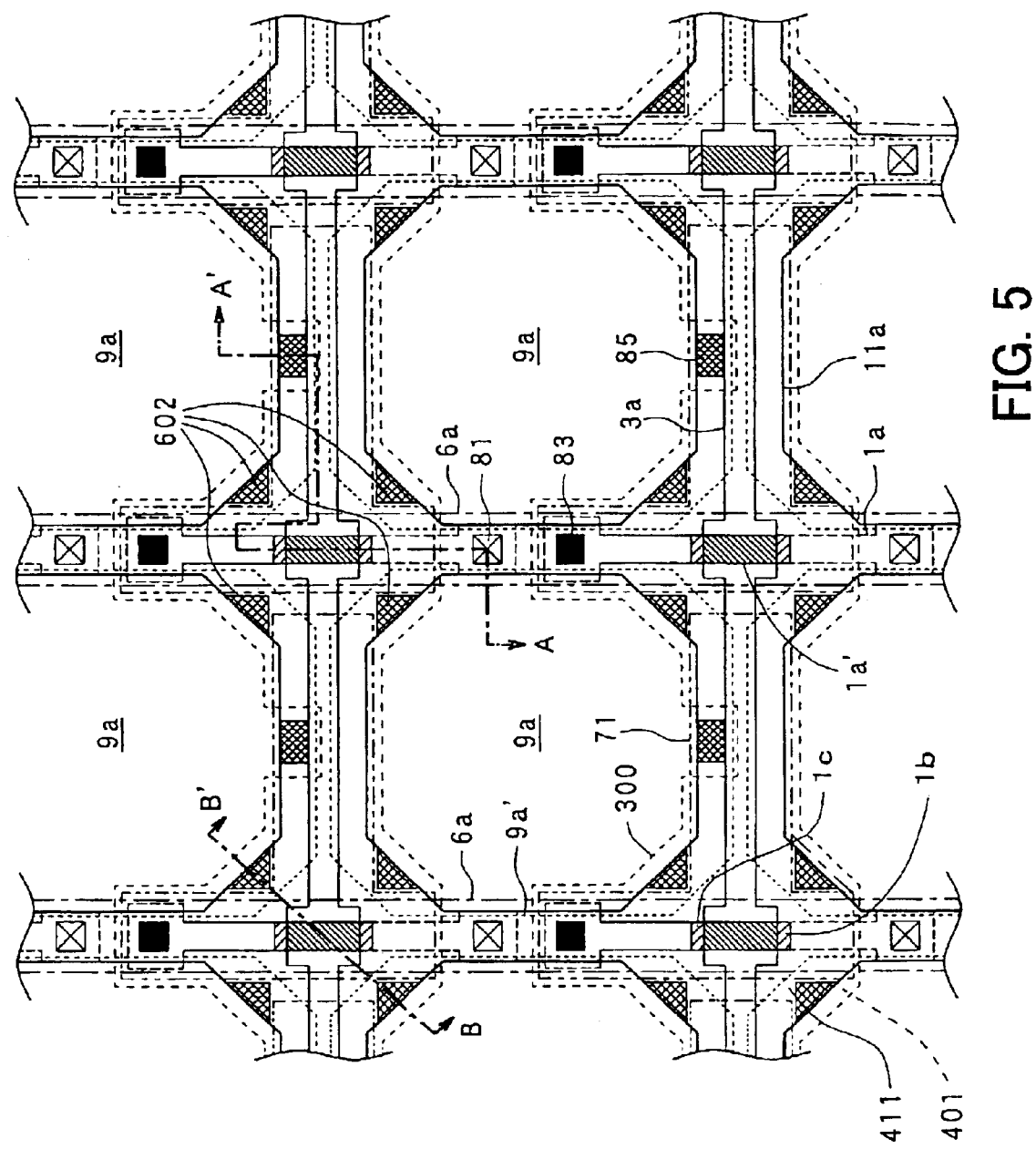
FIG. 5 is a plan view illustrating a plurality of pixel groups which are adjacent each other in a TFT array substrate on which data lines, scanning lines, pixel electrodes, and the like in an electro-optical device of the second exemplary embodiment of the present invention are formed.
Figure 6:
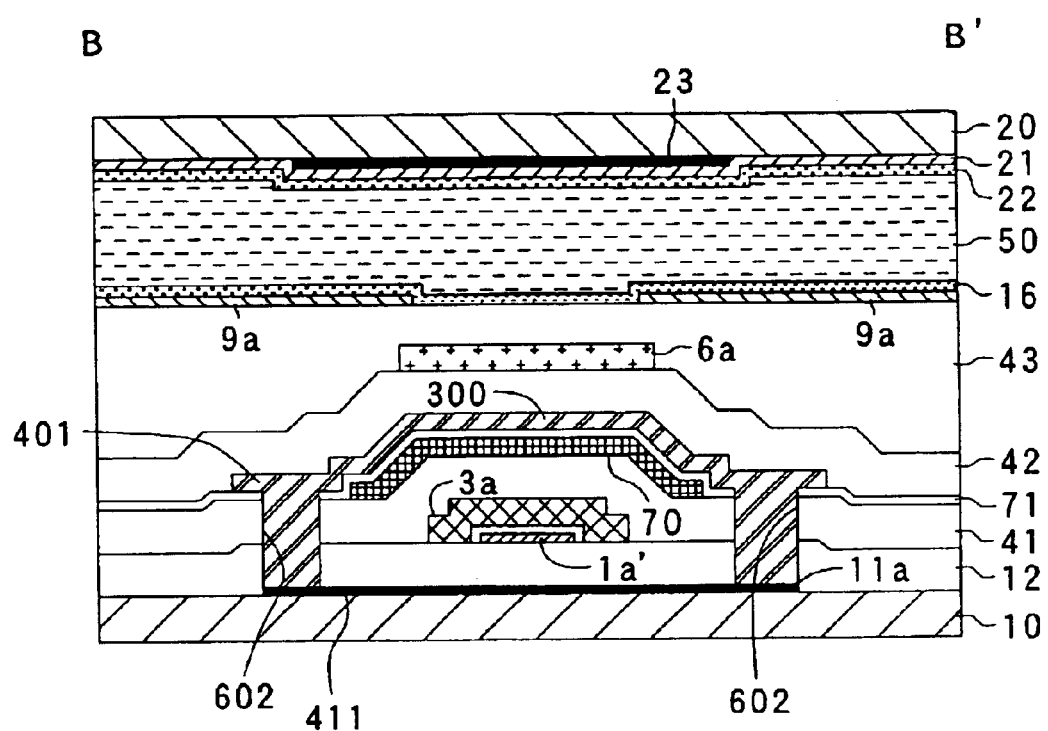
FIG. 6 is a cross-sectional view taken along plane B–B' of FIG. 5.

A second exemplary embodiment of the present invention is described below with reference to FIGS. 5 and 6. FIG. 5 is a plan view illustrating a plurality of pixel groups which are adjacent each other in a TFT array substrate on which data lines, scanning lines, pixel electrodes, and the like in an electro-optical device of the second exemplary embodiment of the present invention are formed, and FIG. 6 is a cross-sectional view taken along plane B–B' of FIG. 5. Furthermore, since each layer or each element in FIG. 6 is illustrated in recognizable size on the drawings, each layer or each element is illustrated having different scales.

In the second exemplary embodiment, a penetrating groove 602 is provided instead of the contact hole 601 in comparison with the aforementioned first exemplary embodiment. The other construction is similar to that of the first exemplary embodiment. For this reason, in FIGS. 5 and 6 according to the second exemplary embodiment, the components similar to those of the first exemplary embodiment shown in FIGS. 1 to 4 are attached by the similar reference numerals and their descriptions are properly omitted.

In FIGS. 5 and 6, the electro-optical device of the second exemplary embodiment comprises the penetrating groove 602 which has a triangular sectional shape according to the profiles of the projecting portions 401 and 411, formed penetrating the first interlayer insulating film 41 and the underlying insulating film 12. The inner portion of the groove is filled with the same material as the capacitor line 300 which is the upper light shielding film, and the capacitor line 300 and the lower light shielding film 11a are connected to each other. In particular, the channel region 1a' and the adjacent regions are constructed to be surrounded by partitions which are wider than the contact hole 601 and are made of a conductive material having light shielding property which is filled in the penetrating groove 602, at four sides of the lateral portions of the regions.

Therefore, according to the second exemplary embodiment, the capacitor line 300 and the lower light shielding film 11a can be electrically connected through the penetrating groove 602 effectively. In addition, the channel region 1a' and the adjacent regions can be widely surrounded by a partition which has a triangular sectional shape according to the profiles of the projecting portions 401 and 411, at the lateral portions of the regions. For this reason, it is possible to further enhance the light shielding performance in comparison with the first exemplary embodiment.

In addition, the sectional shape of the penetrating groove 602 may be, for example, substantially identical to the profile of the projecting portions 401 and 411 and may be a little smaller or greater than the profile of the projecting portions 401 and 411.

Furthermore, since the penetrating groove 602 has greater diameter than the contact hole 601 and is penetrated with width of about several microns, a problem that the stepped portion due to the penetrating groove 602 may be created on the underlying surface of the pixel electrode 9a occurs. However, the lower light shielding film 11a underlying the penetrating groove 602, the underlying insulating film 12, or a region opposite to the penetrating groove 602 in the substrate 10 are formed rising up in a convex shape so that it is possible to alleviate the stepped portion due to the presence of the penetrating groove 602.

(Third Exemplary Embodiment)

Figure 7:
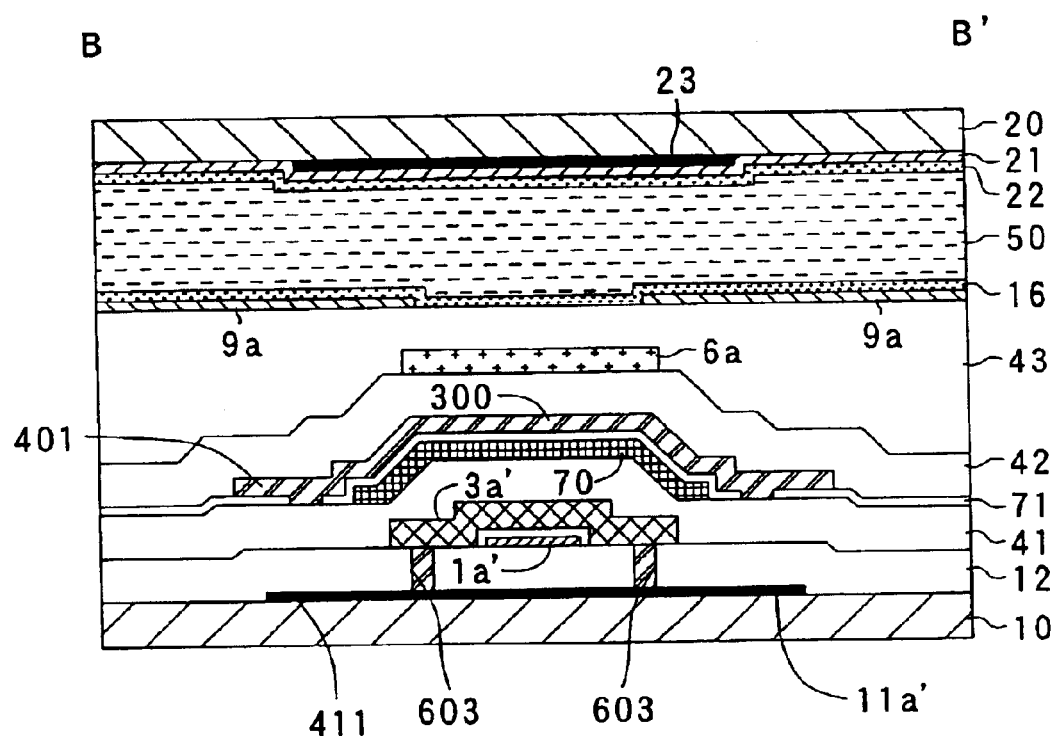
FIG. 7 is a cross-sectional view illustrating a portion corresponding to the section taken along line B–B' of FIG. 2 in an electro-optical device of the third exemplary embodiment of the present invention.

Next, a third exemplary embodiment of the present invention is described below with reference to FIG. 7. Here, FIG. 7 is a cross-sectional view of the third exemplary embodiment corresponding to the section B–B' of FIG. 2. Furthermore, since each layer and each element in FIG. 7 are illustrated in recognizable size on the drawings, each layer and each element are illustrated having different scales.

In the third exemplary embodiment, a contact hole 603 connecting the scanning line 3a' to the lower light shielding film 11a' is provided instead of the contact hole 601 connecting the capacitor line 300 to the lower light shielding film 11a' in comparison with the above first exemplary embodiment. In addition, the lower light shielding film 11a' is constructed to have a stripe shape of the plane pattern along the scanning line 3a' instead of a lattice shape. The other construction is similar to that of the first exemplary embodiment. For this reason, in FIG. 7 according to the third exemplary embodiment, the components similar to those of the first exemplary embodiment shown in FIGS. 1 to 4 are attached by the similar reference numerals and their descriptions are properly omitted.

In FIG. 7, the electro-optical device of the third exemplary embodiment has a structure that the channel region 1a' and the adjacent regions are surrounded by the contact hole 603 at the four sides of the regions. In addition, the contact hole 603 is plugged with a conductive material having a light shielding property. By doing so, since the inner portion of the contact hole 603 is filled with the conductive material having a light shielding property, it is possible to enhance the light shielding performance for the channel region 1a' and the adjacent regions.

Furthermore, since the lower light shielding film 11a' having a striped shape and extending along the scanning line 3a' is connected through the contact hole 603, it serves as redundant wires of the scanning line 3a'. For this reason, the resistance of the scanning line 3a' can be reduced.

In addition, it is preferable that the scanning line 3a' is formed in a manner that the wide portion serving as a gate electrode in the plane pattern is a little greater than that of the scanning line 3a according to the first exemplary embodiment. Accordingly, it is possible to secure the region for providing the contact hole 603 and to dispose the contact hole 603 at the four corner portions without problem.

In the third exemplary embodiment, the aforementioned scanning line 3a' may be removed except for the portion serving as a gate electrode film in the pixel switching TFT 30. In this case, although the redundancy structure is lost, it is possible to obtain a structure that the scanning signal is supplied to the gate electrode film through the contact hole 603 by means of the scanning line made of the lower light shielding film 11a'

Furthermore, the scanning line 3a' or the gate electrode film may be made of a conductive material having a light shielding property. By doing so, although the light shielding scanning line 3a' or the gate electrode film is only formed in the inner portion of the contact hole 603 instead of plugging the contact hole with a conductive material having a light shielding property, it is possible to obtain the structure having an enhanced light shielding performance to the light entering at the lateral portions described above.

Furthermore, in the third exemplary embodiment, the contact hole 603 may be replaced with the wide penetrating groove similar to that of the second exemplary embodiment as described above.

(Fourth Exemplary Embodiment)

Figure 8:
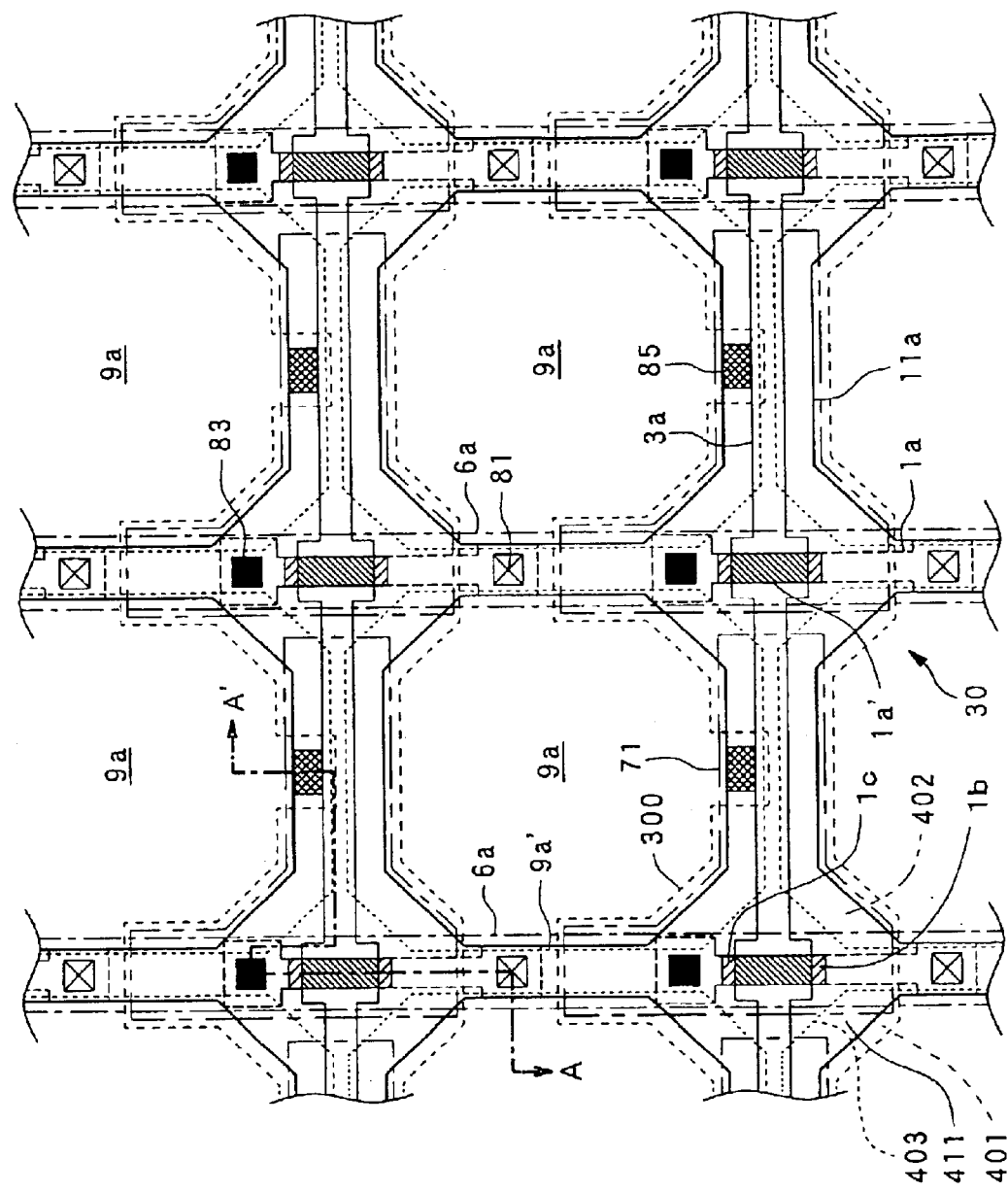
FIG. 8 is a plan view illustrating a plurality of pixel groups which are adjacent each other in a TFT array substrate on which data lines, scanning lines, pixel electrodes, and the like in an electro-optical device of the exemplary embodiment of the present invention are formed.
Figure 9:
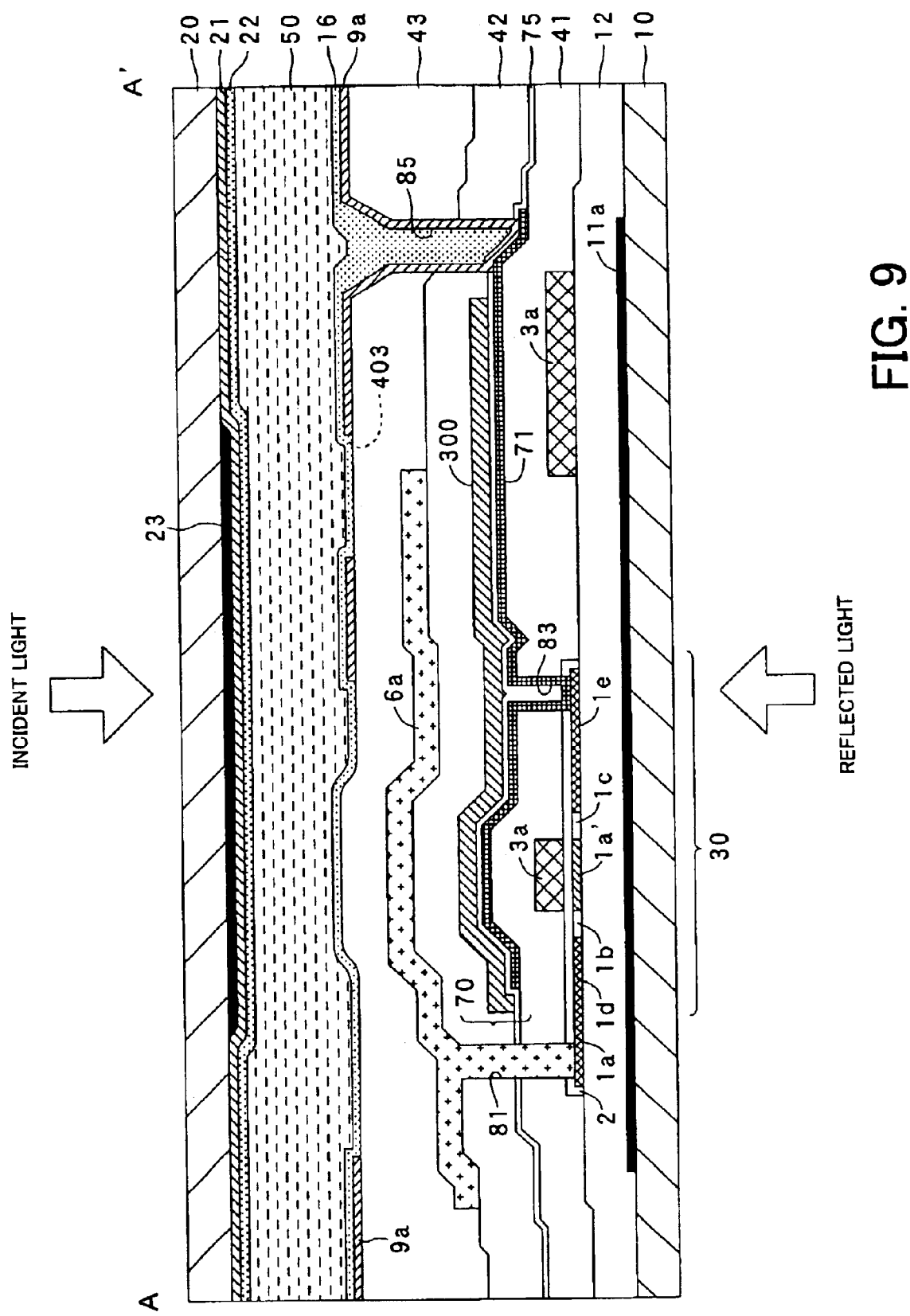
FIG. 9 is a cross-sectional view taken along plane A–A' of FIG. 8.
Figure 11:
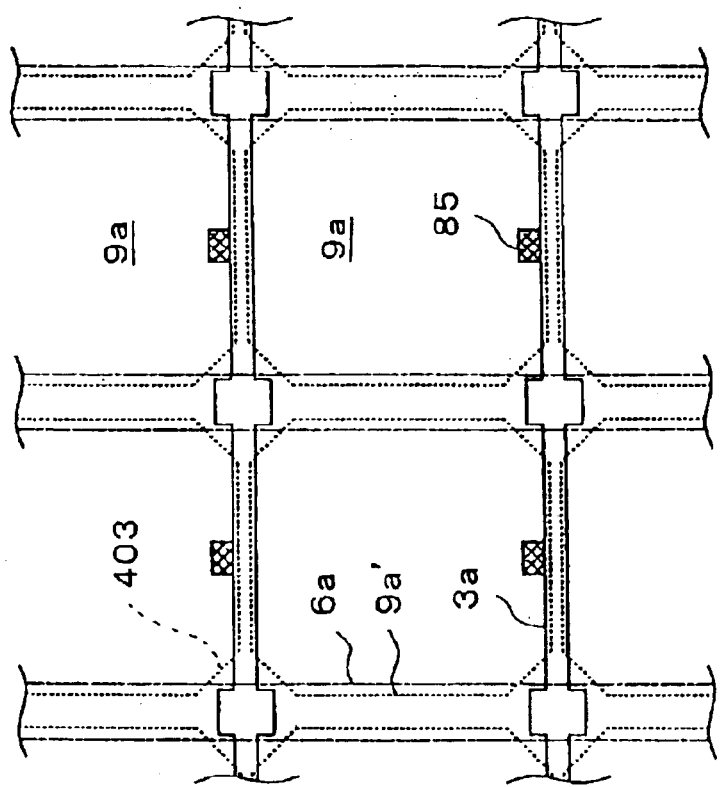
FIG. 11 is a partial plan view illustrating selectively a plane pattern of pixel electrodes of an exemplary embodiment.
Figure 10:
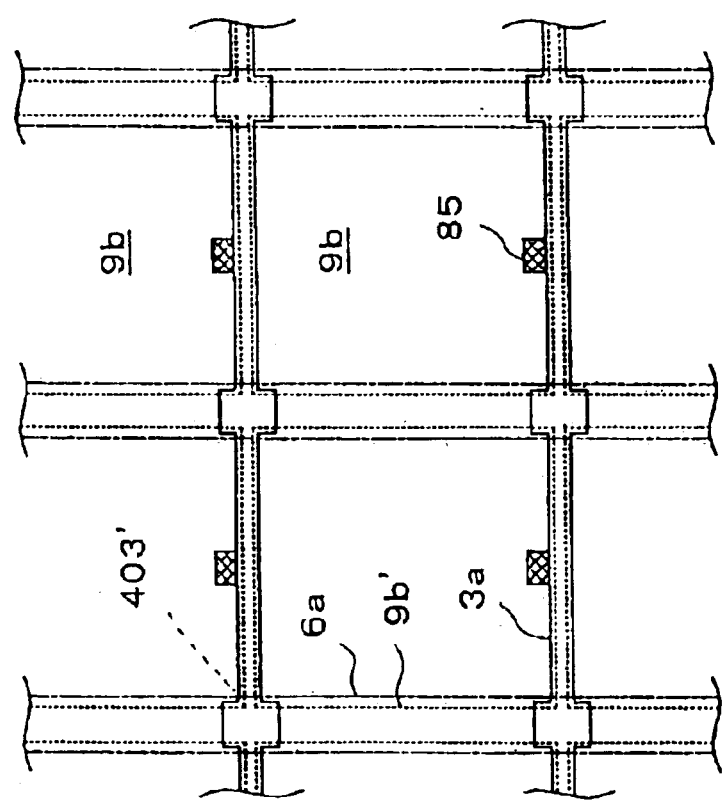
FIG. 10 is a partial plan view illustrating selectively a plane pattern of pixel electrodes of a comparative example.

The fourth exemplary embodiment of the present invention is described below with reference to FIGS. 8 to 11. FIG. 8 is a plan view illustrating plurality of pixel groups which are adjacent each other in a TFT array substrate on which data lines, scanning lines, pixel electrodes, and the like are formed. FIG. 9 is a cross-sectional view taken along Plane A–A' of FIG. 8. FIG. 10 is a partial enlarged view illustrating a selective plane pattern of pixel electrodes of a comparative example and FIG. 11 is a partial enlarged view illustrating a selective plane pattern of pixel electrodes of an exemplary embodiment. In addition, since each layer and each element in FIG. 9 are illustrated in recognizable size on the drawing, each layer and each element are illustrated in different scales.

In the fourth exemplary embodiment, projecting portions 402 is provided in addition to the projecting portions 401 and 411 to define the corner cuts at the opening region of each pixel in the comparison with the above first exemplary embodiment. And also, corner cut portions 403 are provided corresponding to the projecting portion 402. The contact hole 601 is not provided. The other construction is similar to that of the first exemplary embodiment. For this reason, in FIGS. 8 to 11 according to the fourth exemplary embodiment, the components similar to those of the first exemplary embodiment shown in FIGS. 1 to 4 are attached by the similar reference numerals and their descriptions are properly omitted.

In the exemplary embodiment, the relay layer 71 has the projecting portion 402 to form a capacitor opposite to the projecting portion 401 to define such corner cuts. In addition, the construction, operation and effect according to the projecting portions 401, 402 and 411 are described below in detail.

The capacitor line 300 is a fixed potential similar to the first exemplary embodiment. The lower light shielding film 1a may be formed in an extended manner around the image display region to be connected to a constant voltage source similar to the capacitor line 300 in order to preventing or substantially preventing the variation of the voltage from having a bad or negative influence on the TFT 30.

In the exemplary embodiment, the plane pattern of the pixel electrode 9a is not simple quadrilateral but the quadrilateral with their corners cut off corresponding to the corner cut of the opening region of each pixel. In other words, in FIG. 9, corner cut portions 403 are provided corresponding to the projecting portion 401 of the capacitor line 300 and the projecting portion 402 of the relay layer 71. The construction, operation and effect according to the pixel electrode 9a will be described below with reference to FIGS. 10 and 11.

In the exemplary embodiment, the counter substrate 20 comprises the light shielding film 23 formed in a lattice or striped shape at the regions excepting the opening region of the each pixel. By employing the construction, it is possible to more effectively prevent or substantially prevent the incident light from the counter substrate 20 side from entering the channel region 1a' and the adjacent regions by means of the aforementioned light shielding film 23 as well as the data line 6a and the capacitor line 300 constituting the upper light shielding film as described above. Various modified examples according to the plane pattern of the light shielding film 23 formed on the counter substrate 20 are described below with reference to FIGS. 14 to 21. And also, the light shielding film 23 may be made of various types of metal film and the like similar to the capacitor line 300 or resin.

Furthermore, in the exemplary embodiment, although the capacitor line 300 includes the projecting portion 401 and the lower light shielding film 11a includes the projecting portion 411, the only one projecting portion may be provided. In this case, it is possible to enhance the light shielding performance in comparison with the case that no projecting portion is provided.

The construction, operation and effect according to the plane pattern whose corners are cut off from the pixel electrode 9a is described below with reference to FIGS. 10 and 11.

In the comparative example shown in FIG. 10, the pixel electrode 9b has the plane pattern of quadrilateral. Therefore, the interval between the pixel electrodes 9b which are adjacent each other in the horizontal direction and in the vertical direction is constant in the intersection region and light shielding region except the intersection region. However, since the pixel electrode 9b is formed by patterning ITO film and the like, film residual due to resist residual during patterning process may more or less occur. In particular, in the intersection region where the data line 6a and the scanning line 3a is intersected to easily create large stepped portion, the patterning is more difficult than in a flat location and then film residual is easily created. Therefore, it is necessary to extend the constant interval between the pixel electrodes 9b which are adjacent each other in the horizontal direction and in the vertical direction up to the degree that short circuit due to the film residual does not occur even in the intersection region.

On the contrary, in the exemplary embodiment shown in FIG. 11, the pixel electrode 9a has the plane pattern including the corner cut portions 403. In addition, since the corner cut portions 403 make the pixel electrode 9a itself rarely or never exist in the intersection portion controlling the interval to avoid short-circuit due to the residual film. It is not necessary to consider the film residual in the region. In other words, it is possible to reduce the interval between the pixel electrodes 9b to the degree that short circuit due to the film residual does not occur in the light shielding region except the intersection region where the film residual originally occurs little during the patterning process. Therefore, the opening region of each pixel can be extended by that degree and then the aperture ratio of each pixel can be enhanced without loss of the device yield or reliability. Furthermore, since it is advantageous in obtaining the fineness of the pixel pitch, the highly fine image display can be achieved.

In addition, when the interval between the pixel electrodes 9a is, for example, 3 $\mu$m, the stepper having accuracy of 1 $\mu$m can be used to perform pattering with sufficiently high reliability and with relative ease if the pixel electrodes 9a have the corner cut portions 403, as shown in FIG. 11.

In such exemplary embodiment, since the pixel electrodes 9a have the corner cut portions 403, it is possible to perform bright image display in accordance to high aperture ratio. In addition, the projecting portions 401 and 411 having a light shielding property are provided corresponding to the corner cut portions 403, it is possible to avoid or substantially avoid leakage of light at the corner cut portions 403 and reduction of the contrast ratio.

On the other hand, according to the exemplary embodiment, since the storage capacitor 70 is also formed in the light shielding region to define such corner cuts, it is possible to effectively prevent or substantially prevent the opening region of each pixel from being reduced while increasing the value of capacitance. Similarly, the drain electrode of the TFT 30 may be also formed in the light shielding region to define such corner cuts in order to prevent or substantially prevent the opening region of each pixel from being reduced.

As described above with reference to FIGS. 8 to 11, according to the exemplary embodiment, it is possible to reduce the display irregularity or flicker by means of the pixel switching TFT 30 having excellent transistor characteristics and to obtain the electro-optical device performing the image display with high brightness, high fineness, or high quality.

In the exemplary embodiment described above, although the potentials of the peripheral regions of the lower light shielding film 11a are dropped down to fixed potentials or become floating potentials, the lower light shielding film 11a may be connected to the capacitor line 300 in the image display region in order to be dropped down to fixed potentials. In this case, the lower light shielding film 11a can serve as a redundant wire of the capacitor line 300 and it is possible to make the resistance of the capacitor line 300 reduced. Alternatively, the lower light shielding film 11a may be connected to the scanning line 3a every pixel or every plural pixels along the scanning line 3a or the lower light shielding film 11a may be formed in shape of approximate stripes divided every scanning line 3a. In this case, the lower light shielding film 11a can serve as a redundant wire of the scanning line 3a and it is possible to make the resistance of the scanning line 3a reduced. In addition, since the lower light shielding film 11a is used for a redundant wire, it is possible to make the width of the light shielding region in accordance to the capacitor line 300 or the scanning line 3a reduced.

Furthermore, in the above exemplary embodiments, although it is preferable that, as shown in FIG. 9, the pixel switching TFT 30 has a LDD structure, it may have an offset structure that any impurities are not implanted into the lightly doped source region 1b and the lightly doped drain region 1c. Alternatively, it may be a self-aligned TFT on which highly doped source and drain regions are formed in a self aligned way by implanting impurities having high concentration using the gate electrode constituting a portion of the scanning line 3a as a mask.

(Modified Example of Pixel Electrode Pattern)

Figure 13:
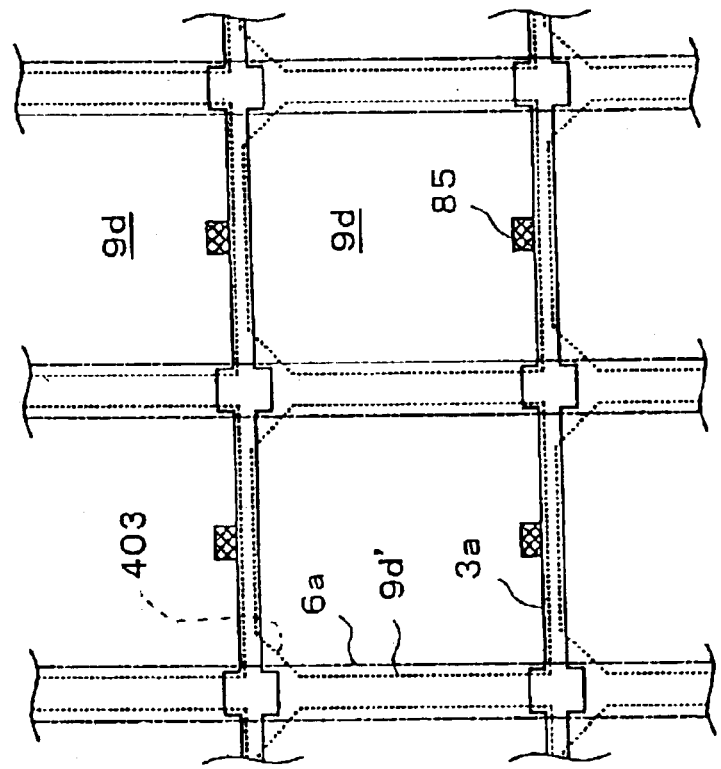
FIG. 13 is a partial plan view illustrating a modified example of a plane pattern of pixel electrodes adoptable in an exemplary embodiment.
Figure 12:
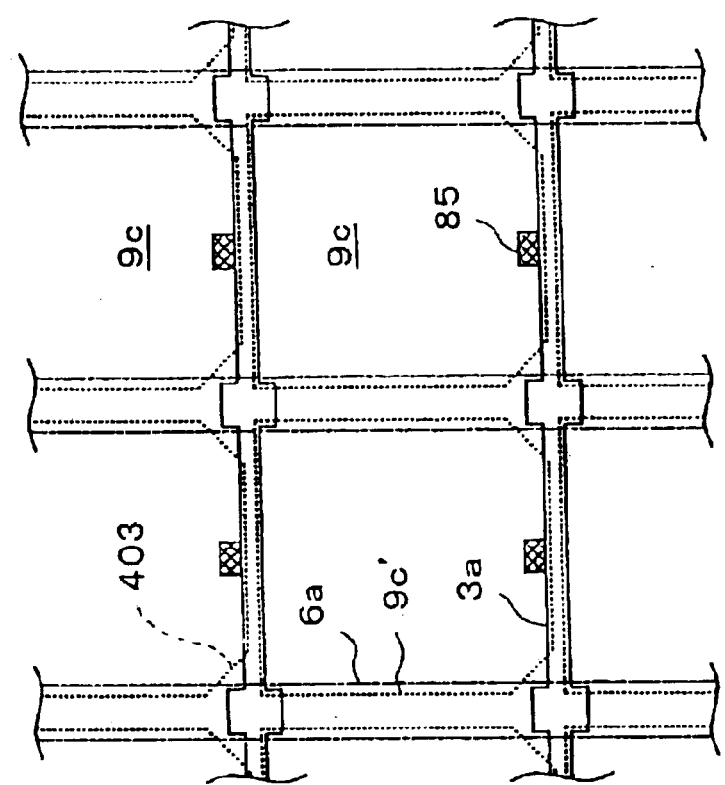
FIG. 12 is a partial plan view illustrating a modified example of a plane pattern of pixel electrodes adoptable in an exemplary embodiment.

The plane pattern forms of the pixel electrode adoptable in the fourth exemplary embodiment described above are described below with reference to FIGS. 12 and 13. FIGS. 12 and 13 illustrate the pixel electrodes having the plane patterns adoptable in the present exemplary embodiment instead of the pixel electrode 9a shown in FIG. 11. Further, in FIGS. 12 and 13, the components similar to those shown in FIGS. 1 to 11 are attached by the similar reference numerals and their descriptions are properly omitted.

In other words, the pixel electrode 9c may includes the corner cut portions 403 where two angles located at the lower side of the drawing are cut off as shown in FIG. 12.

Alternatively, the pixel electrode 9d may include the corner cut portions 403 where two angles located at the upper side of the drawing are cut off as shown in FIG. 13.

In the modified examples shown in FIGS. 12 and 13, since the film residual can be also reduced at the intersection portion during the patterning process as described above, it is possible to effectively reduce or substantially reduce the interval between the pixel electrodes 9a. Accordingly, the opening region of each pixel can be extended by that degree and then the aperture ratio of each pixel can be enhanced without loss of the device yield or reliability.

Further, for example, in case of the 1H inversed drive type in which the polarity of driving voltage is inversed in a field unit every row, the horizontal electric field is generated between the pixel electrodes 9c latitudinally adjacent each other or between the pixel electrodes 9d longitudinally adjacent each other in FIGS. 12 and 13. Furthermore, in case of the 1S inversed drive type in which the polarity of driving voltage is inversed in a field unit every column, the horizontal electric field is generated between the pixel electrodes 9c latitudinally adjacent each other or between the pixel electrodes 9d longitudinally adjacent each other in FIGS. 12 and 13. Furthermore, the alignment failure of the liquid crystal layer 50 due to the horizontal electric field hardly occurs uniformly all over the region in each pixel but tends to occur at any one corner in accordance with the rubbing direction on the oriented films 16 and 22. Therefore, in order to weaken the horizontal electric field between the pixel electrodes where the horizontal electric field to be a cause of the alignment failure occurs, as shown in FIGS. 12 and 13, the corner cut portions 403 may be provided selectively. More specifically, it is preferable that the corner cuts are formed at the corners in which the alignment failure is generated in each pixel. As a result, it is possible to display a high contrast, bright and high quality image.

And also, the aforementioned projecting portion 401 or 411 may be provided corresponding to the corner where the corner cut portions 403 are provided. Alternatively, the aforementioned projecting portion 401 or 411 may be provided at the corner where the corner cut portions 403 are not provided.

(Modified Examples of Light Shielding Film Pattern on Counter Substrate)

The plane pattern forms of the light shielding film 23 on the counter substrate 20 adoptable in the fourth exemplary embodiment, etc., described above will be described with reference to FIGS. 14 to 21. FIGS. 14 to 21 are partial plan views illustrating the modified examples according to the plane patterns of the light shielding films 23 on the counter substrates 20 side adoptable in the exemplary embodiments, respectively. Further, in FIGS. 14 to 21, the components similar to those shown in FIGS. 1 to 11 are attached by the similar reference numerals and their descriptions are properly omitted.

In the above exemplary embodiments, the light shielding film 23 on the counter substrate 20 has a lattice or striped shape and its plane shape is a little smaller than the upper light shielding film made of the capacitor line 300 and the data line 6a without defining a non-opening region of each pixel. In other words, the light shielding film 23 is an auxiliary light shielding film with respect to the upper light shielding film and commonly provided for thermal accident. On the contrary, in the modified examples of FIGS. 14 to 17, the light shielding films 23a to 23d on the counter substrates 20 are formed to be at least partially a little greater than such an upper light shielding film and to at least partially define a non-opening region of each pixel. Further, in any modified examples, the region opposite to the projecting portion 401 is also provided with the light shielding film.

Figure 14:
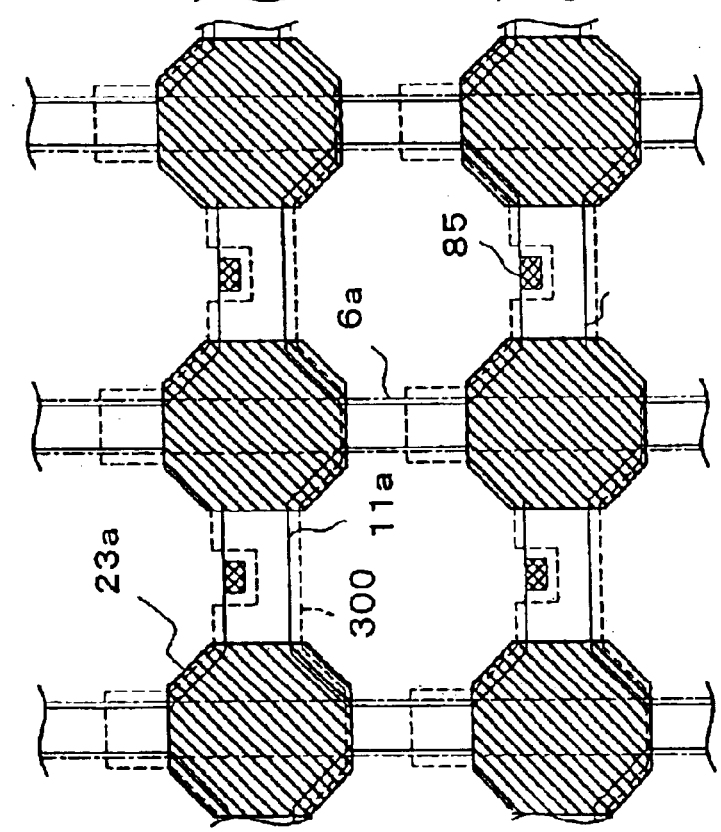
FIG. 14 is a partial plan view illustrating a modified example of a plane pattern of a light shielding film on a counter substrate side adoptable in an exemplary embodiment.

In other words, in the modified example of FIG. 14, the light shielding film 23a is provided on the counter substrate 20 in an island shape in the only intersection region among the light shielding regions where the upper light shielding film (that is, the capacitor line 300 and the data line 6a) exists. If the light shielding film 23a is used, it is possible to remarkably enhance the light shielding performance to the pixel switching TFT 30 at the vicinity of the intersection region. Furthermore, it is possible to define the non-opening region of each pixel at the intersection region.

Figure 15:
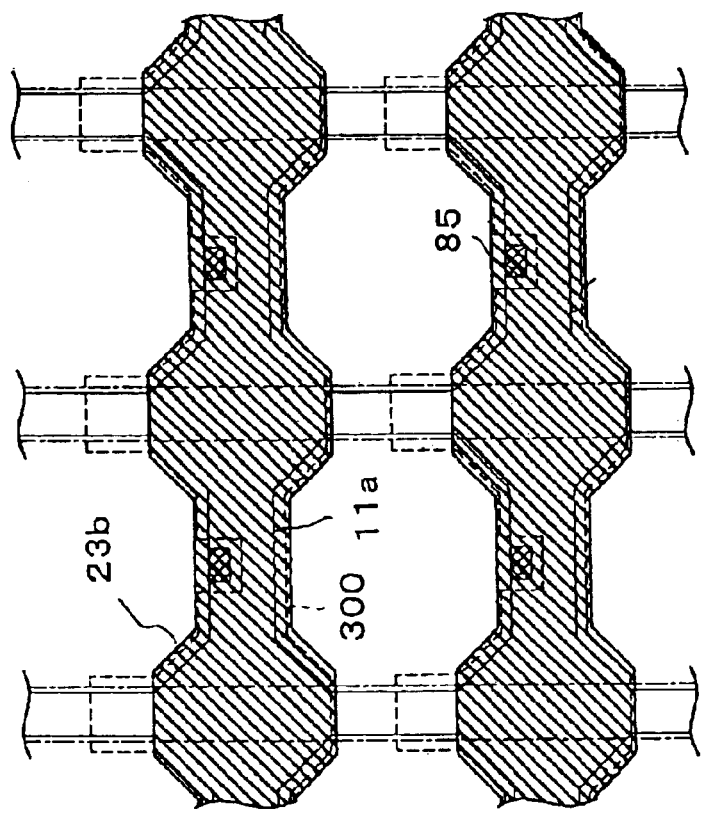
FIG. 15 is a partial plan view illustrating a modified example of a plane pattern of a light shielding film on a counter substrate side adoptable in an exemplary embodiment.

In the modified example of FIG. 15, the light shielding film 23b is provided on the counter substrate 20 in an approximately transverse striped shape in the only region along the intersection region and the scanning line 3a among the light shielding regions where the upper light shielding film exists. If the light shielding film 23b is used, it is possible to remarkably enhance the light shielding performance to the pixel switching TFT 30 at the regions along the vicinity of the intersection region and the scanning line 3a. Furthermore, it is possible to define the non-opening region at the regions of each pixel along the intersection region and the scanning line 3a.

Figures 16, 17:
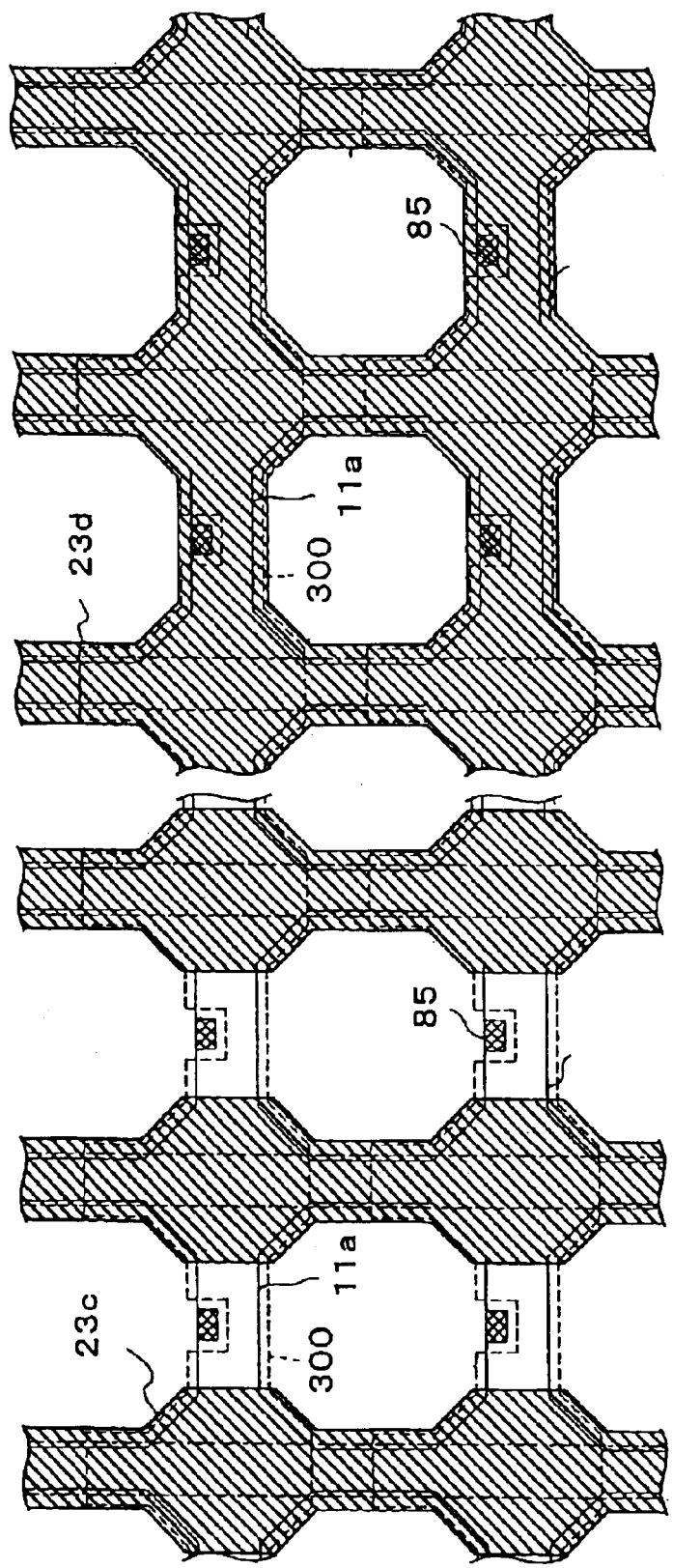
FIG. 16 is a partial plan view illustrating a modified example of a plane pattern of a light shielding film on a counter substrate side adoptable in an exemplary embodiment.
FIG. 17 is a partial plan view illustrating a modified example of a plane pattern of a light shielding film on a counter substrate side adoptable in an exemplary embodiment.

In the modified example of FIG. 16, the light shielding film 23c is provided on the counter substrate 20 in an approximately longitudinal stripe shape in the only region along the intersection region and the data line 6a among the light shielding regions where the upper light shielding film exists. If the light shielding film 23c is used, it is possible to remarkably enhance the light shielding performance to the pixel switching TFT 30 at the regions along the vicinity of the intersection region and the data line 6a. Furthermore, it is possible to define the non-opening region of each pixel at the regions along the intersection region and the data line 6a.

In the modified example of FIG. 17, the light shielding film 23d is provided on the counter substrate 20 in an approximately lattice shape in the region where the upper light shielding film exists. If the light shielding film 23d is used, it is possible to remarkably enhance the light shielding performance to the pixel switching TFT 30 at all the non-opening regions having lattice shapes. Furthermore, it is possible to define the non-opening region having the lattice shape.

As described above, in the modified examples of FIGS. 14 to 17, the non-opening regions having lattice shapes are at least partially defined by use of the light shielding films 23a to 23d on the counter substrate 20. On the contrary, in the modified examples of FIGS. 18 to 21, the light shielding films 23a' to 23d' on the counter substrate 20 are constituted to be a little smaller than the upper light shielding film without defining a non-opening region. Further, in any modified examples, the region opposite to the projecting portion 401 is also provided with the light shielding film which is a little smaller.

Figure 18:
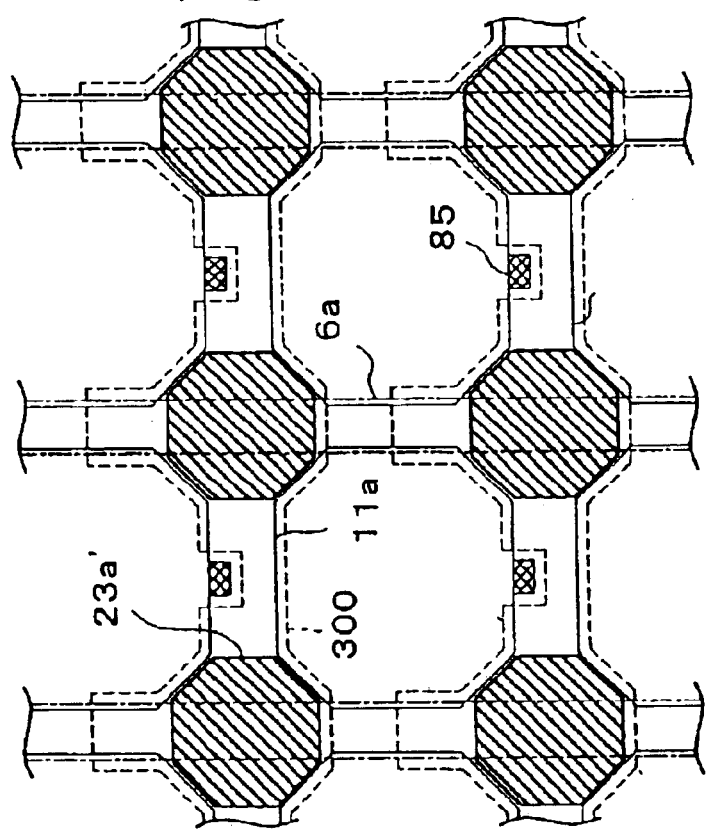
FIG. 18 is a partial plan view illustrating a modified example of a plane pattern of a light shielding film on a counter substrate side adoptable in an exemplary embodiment.

In other words, in the modified example of FIG. 18, the light shielding film 23a' is provided on the counter substrate 20 in an island shape in the only intersection region among the light shielding regions where the upper light shielding film (that is, the capacitor line 300 and the data line 6a) exists. If the light shielding film 23a' is used, it is possible to remarkably enhance the light shielding performance to the pixel switching TFT 30 at the vicinity of the intersection region. In addition, since the light shielding film 23a' is formed to be a little smaller than the projecting portion 401, it is possible to effectively prevent or substantially prevent the light shielding film 23a' from reducing the opening region due to the mechanical assembling deviation of the TFT array substrate 10 and the counter substrate 20 during the production.

Figure 19:
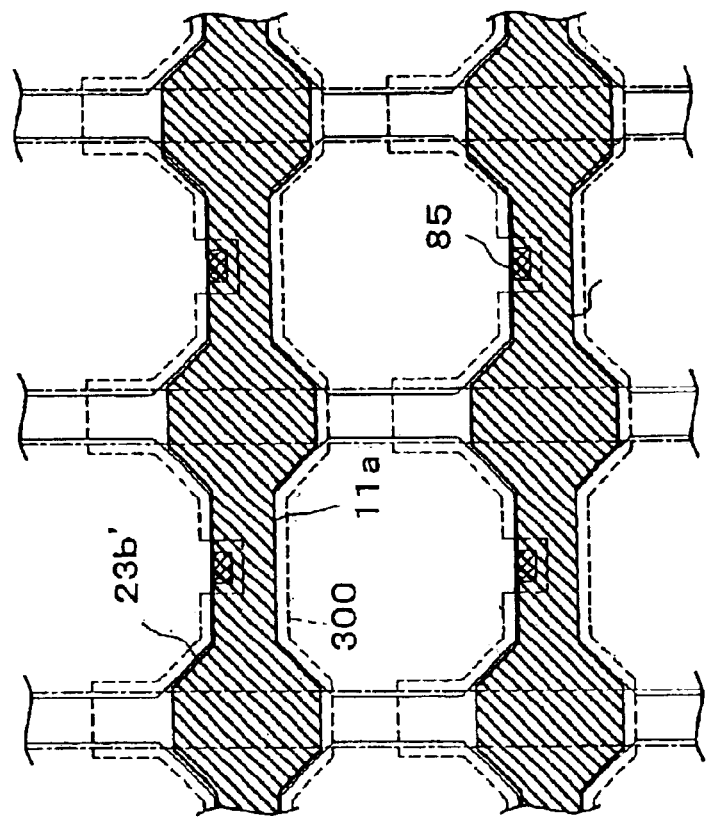
FIG. 19 is a partial plan view illustrating a modified example of a plane pattern of a light shielding film on a counter substrate side adoptable in an exemplary embodiment.

In the modified example of FIG. 19, the light shielding film 23b' is provided on the counter substrate 20 in an approximately transverse striped shape in the only region along the intersection region and the scanning line 3a among the light shielding regions where the upper light shielding film exists. If the light shielding film 23b' is used, it is possible to remarkably enhance the light shielding performance to the pixel switching TFT 30 at the regions along the vicinity of the intersection region and the scanning line 3a. In addition, since the light shielding film 23b' is formed to be a little smaller than the projecting portion 401 and the capacitor line 300, it is possible to effectively prevent or substantially prevent the light shielding film 23b' from reducing the opening region due to the mechanical assembling deviation of the TFT array substrate 10 and the counter substrate 20 during the production.

Figures 20, 21:
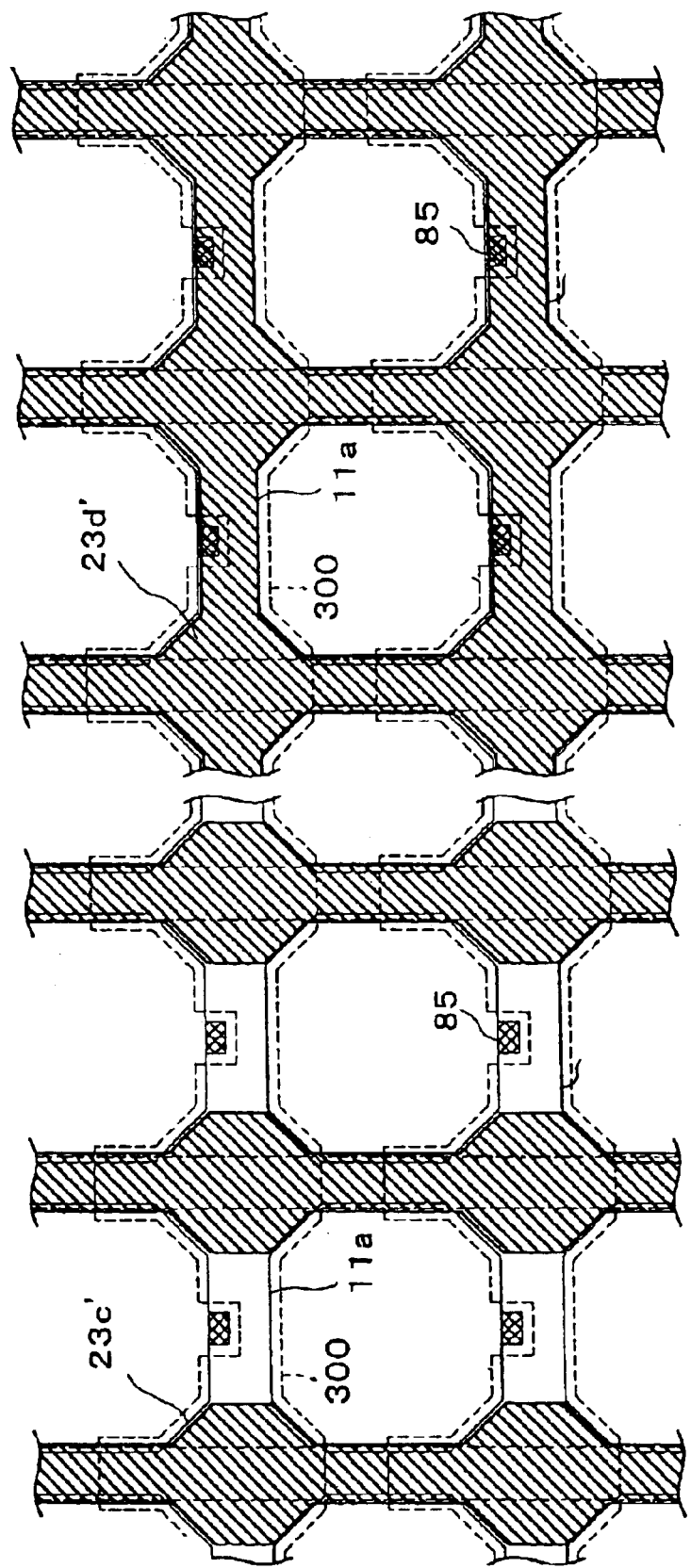
FIG. 20 is a partial plan view illustrating a modified example of a plane pattern of a light shielding film on a counter substrate side adoptable in an exemplary embodiment.
FIG. 21 is a partial plan view illustrating a modified example of a plane pattern of a light shielding film on a counter substrate side adoptable in an exemplary embodiment.

In the modified example of FIG. 20, the light shielding film 23c' is provided on the counter substrate 20 in an approximately longitudinal striped shape in the only region along the intersection region and the data line 6a among the light shielding regions where the upper light shielding film exists. If the light shielding film 23c' is used, it is possible to remarkably enhance the light shielding performance at the regions along the vicinity of the intersection region and the data line 6a for the pixel switching TFT 30. In addition, since the light shielding film 23c' is formed to be a little smaller than the projecting portion 401 and the data line 6a, it is possible to effectively prevent or substantially prevent the light shielding film 23c' from reducing the opening region due to the mechanical assembling deviation of the TFT array substrate 10 and the counter substrate 20 during the production.

In the modified example of FIG. 21, the light shielding film 23d' is provided on the counter substrate 20 in an approximately lattice shape in the region where the upper light shielding film exists. If the light shielding film 23d' is used, it is possible to remarkably enhance the light shielding performance at all the non-opening regions having lattice shapes for the pixel switching TFT 30. In addition, since the light shielding film 23d' is formed to be a little smaller than the projecting portion 401, the capacitor line 300 and the data line 6a, it is possible to effectively prevent or substantially prevent the light shielding film 23d' from reducing the opening region due to the mechanical assembling deviation of the TFT array substrate 10 and the counter substrate 20 during the production.

As described above with reference to FIGS. 14 to 21, in the exemplary embodiments, various types of the projecting portions of the capacitor line 300, the relay layer 71 and the lower light shielding film 11a or the corner cut portions of the pixel electrode 9a can be adopted and also their various combinations are available. Furthermore, in the adaptation of the combination, the best combination may be empirically or experimentally determined in view of the specification of the real device.

(The Entire Construction of Electro-optical Device)

Figure 22:
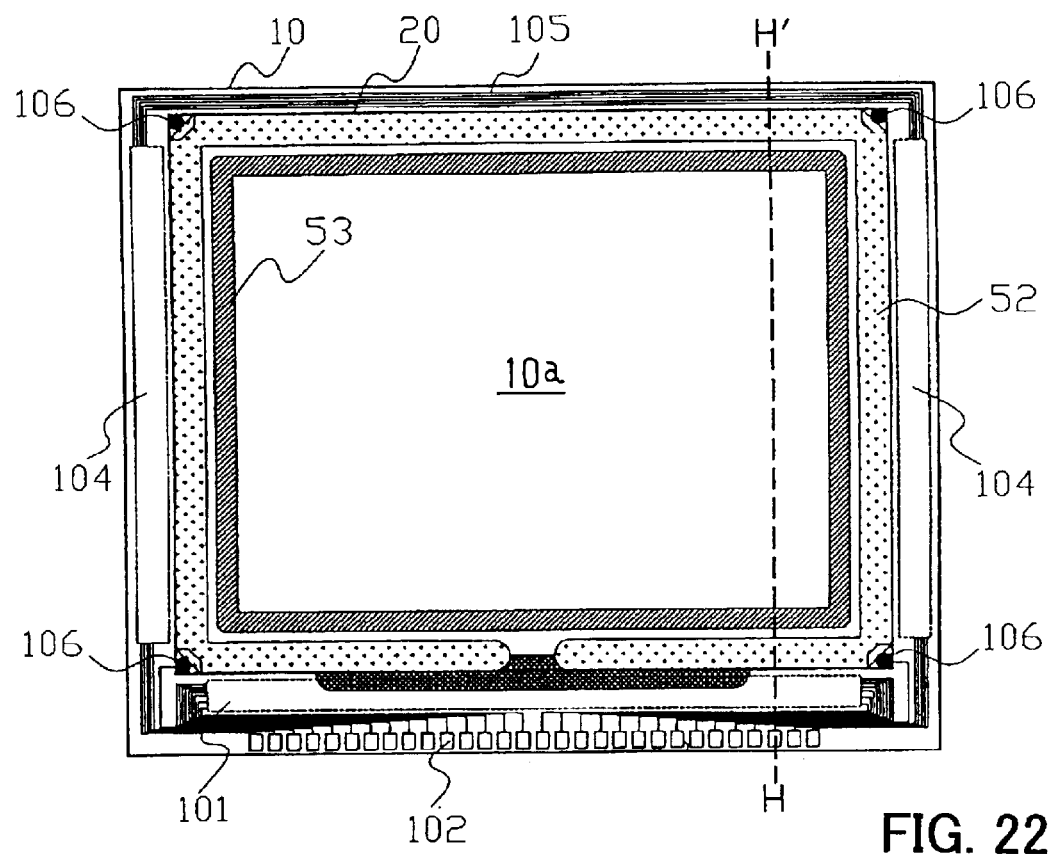
FIG. 22 is a plan view illustrating a TFT array substrate and each of components formed thereon as viewed at a counter substrate in an electro-optical device of an exemplary embodiment.
Figure 23:
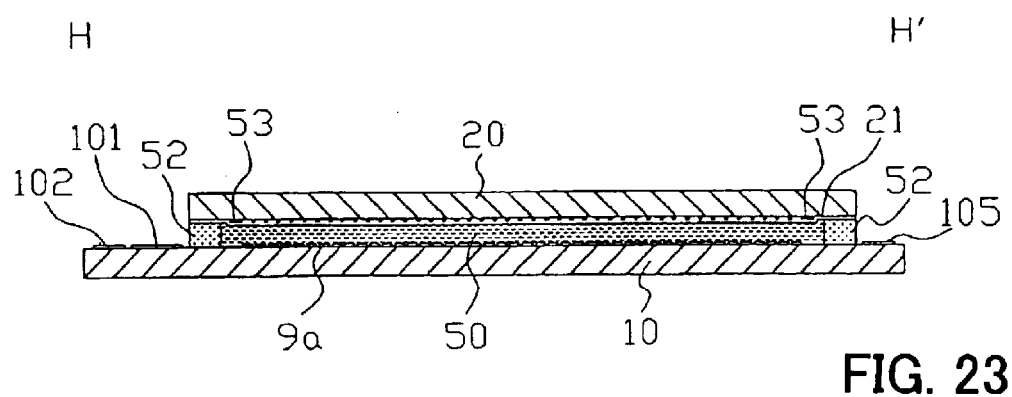
FIG. 23 is a cross-sectional view taken along plane H–H' of FIG. 22.

The entire construction of the electro-optical device in each exemplary embodiment constructed as discussed above is described below with reference to FIGS. 22 and 23. FIG. 22 is a plan view illustrating a TFT array substrate 10 along with the respective components formed thereon when viewed at a counter substrate 20, and FIG. 23 is a cross-sectional view taken along a line H–H' of FIG. 22.

In FIG. 22, the sealing member 52 is formed on the TFT array substrate 10 along its edge, and the light shielding film 53 is provided parallel to the inner side as a frame to define the peripheries of the image display region 10a. The data line drive circuit 101 and the outer circuit connecting terminals 102 are provided on the outer region of the sealing member 52 along one side of the TFT array substrate 10. The data line drive circuit drives the data line 6a by supplying the image signal to the data line 6a at a predetermined timing. Further, the scanning line drive circuits 104 are provided along two sides adjacent to the one side. The scanning line drive circuits 104 drive the scanning line 3a by supplying the scanning signal to the scanning line 3a at a predetermined timing. If delay of the scanning signal supplied to the scanning line 3a does not matter, it is needless to say that the scanning line drive circuit 104 may be provided on only one side. Furthermore, the data line drive circuit 101 may be arranged on both sides along sides of the image display region 10a. Furthermore, a plurality of wires 105 are provided on the remaining one side of the TFT array substrate 10. The wires connect the scanning line drive circuits 104 to each other arranged on both sides of the image display region 10a. Furthermore, the conductive member 106 to electrically connect the TFT array substrate 10 and the counter substrate 20 to each other is provided on at least one corner of the corners of the counter substrate 20. Furthermore, as shown in FIG. 23, the counter substrate 20 having a profile almost identical to the sealing member 52 shown in FIG. 22 is fixed to the TFT array substrate 10 using the sealing member 52.

Furthermore, in addition to the data line drive circuit 101 and the scanning line drive circuits 104, a sampling circuit to apply the image signals to the plurality of data lines 6a at a predetermined timing, a precharging circuit to supply the precharging signal of a predetermined voltage level to the plurality of data lines 6a prior to the image signal, a inspection circuit to inspect the quality or the defect of the electro-optical device during manufacture or in shipping, and the like may be formed on the TFT array substrate 10.

In the exemplary embodiments described above with reference to FIGS. 1 to 23, the data line drive circuits 101 and the scanning line drive circuits 104 may be electrically and mechanically connected to the driving LSI provided, for example, on the TAB (Tape Automated Bonding) substrate through an anisotropic conductive film provided in the peripheries of the TFT array substrate 10, in place of providing them on the TFT array substrate 10. Furthermore, the side of the counter substrate 20 to which the projecting light enter and the side of the TFT array substrate 10 from which the output light is output are provided with a polarizing film, a phase difference film, a polarizing plate and the like in a predetermined direction, in accordance with the operation mode such as a TN (Twisted Nematic) mode, an STN (Super Twisted Nematic) mode, a VA (Vertically Aligned) mode, a PDLC (Polymer Dispersed Liquid Crystal) mode etc. or the normally white mode/normally black mode, respectively.

Since the electro-optical devices in the exemplary embodiments described above apply to the projector, three sheets of electro-optical devices are used as the light valves for RGB, respectively and the respective color lights analyzed through the dichroic mirror for analyzing the RGB colors are input to the respective light valves as the projecting light. Therefore, in the respective exemplary embodiments, the counter substrate 20 is not provided with the color filter. However, in a predetermined region opposite to the pixel electrodes 9a, the color filters of RGB may be formed on the counter substrate 20 along with the protective film thereof. By doing so, the electro-optical devices in the respective exemplary embodiments can apply to the direct view type or reflection type of color electro-optical apparatuses other than the projector. Alternatively, the color filter layer may be formed below the pixel electrodes 9a opposite to RGB on the TFT array substrate 10 out of the color resist and the like. By doing so, through enhancement in condensing efficiency of the incident light, it is possible to realize a bright electro-optical device. Furthermore, by depositing several interference layers having different refractive indexes on the counter substrate 20, the dichroic filter for making RGB colors using interference of light may be formed. By the counter substrate on which the dichroic filter is formed, it is possible to realize the brighter color electro-optical device.

(Exemplary Embodiment of Electronic Apparatus)

Next, an exemplary embodiment of the projection type color display apparatus that is an example of electronic apparatuses using the electro-optical device described above as light valve is described below in detail with respect to the whole construction, specifically, the optical construction thereof. Here, FIG. 24 is a schematic cross-sectional view of the projection type color display apparatus.

Figure 24:
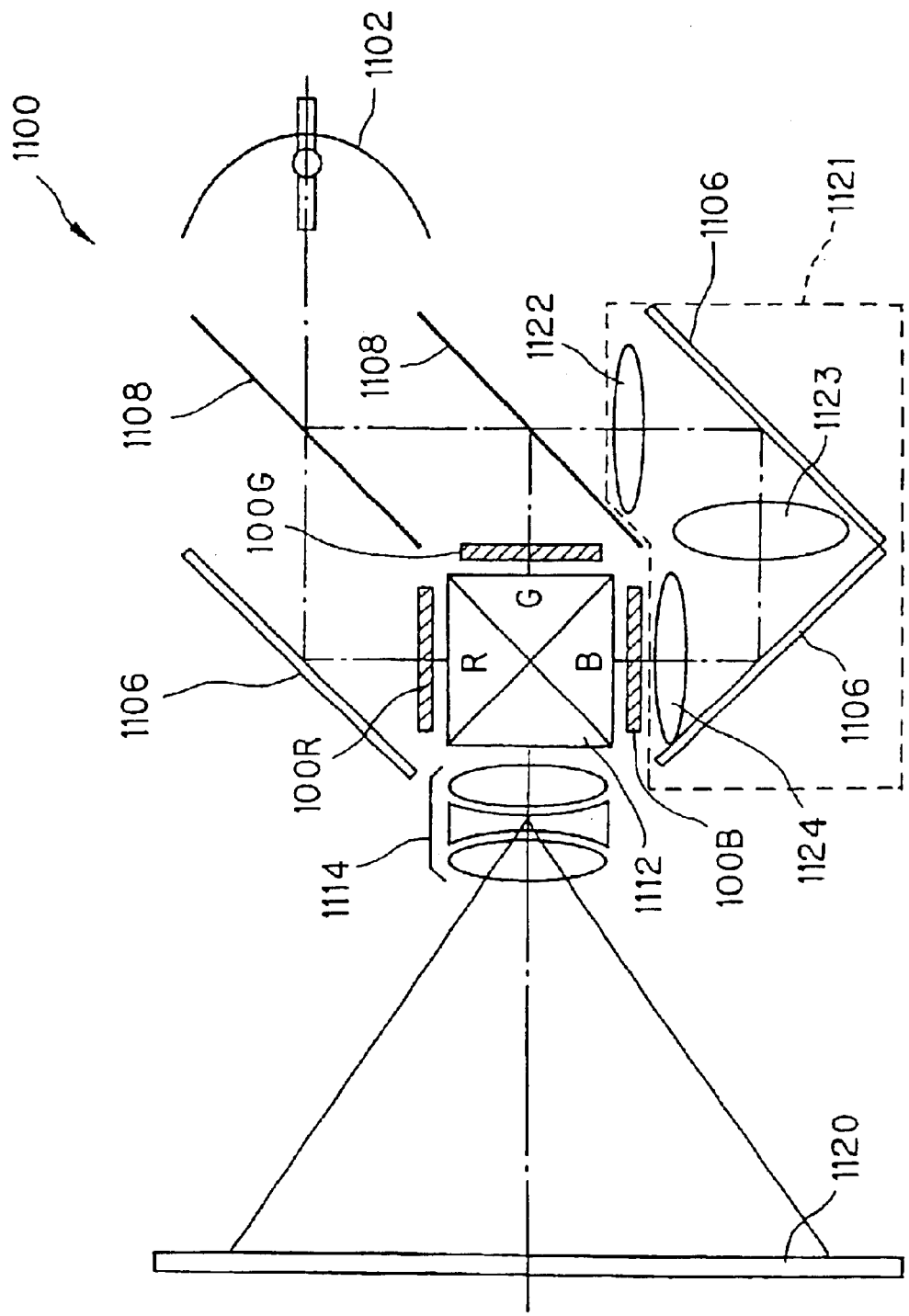
FIG. 24 is a cross-sectional view schematically illustrating a color liquid crystal projector as an example of an exemplary embodiment of an electronic apparatus according to the present invention.

In FIG. 24, the liquid crystal projector 1100 that is an example of the projection type color display apparatus in this exemplary embodiment includes three liquid crystal modules including a liquid crystal device 100 in which the drive circuit is mounted on the TFT array substrate, and is constructed as a projector employing them as the light valves 100R, 100G and 100B for RGB, respectively. In the liquid crystal projector 1100, when the projecting light is emitted from a lamp unit 1102 that is a white light source, such as a metal halide lamp, etc., it is divided into the light components R, G, B corresponding to the three primary colors of RGB through three sheets of mirrors 1106 and two sheets of dichroic mirrors 1108 and they are guided to the light valves 100R, 100G and 100B corresponding to the respective colors. At that time, the light B is guided through a relay lens system 1121 including an input lens 1122, a relay lens 1123 and an output lens 1124 in order to prevent loss of light due to a long light path. Further, the light components corresponding to three primary colors modulated through the light valves 100R, 100G and 100B, respectively, are synthesized again through a dichroic prism 1112 again and then it is projected to a screen 1120 through a projecting lens 1114 as a color image.

The present invention is not limited to the above exemplary embodiments, but may be properly varied within a range not separated from the gist or spirit of invention which can be understood from all of the claims and the specification, and the electro-optical device and the electronic apparatus according to such variation are also included within the technical scope of the present invention.

What is claimed is:

1. An electro-optical device, comprising:
a substrate;
pixel electrodes formed above the substrate;
thin film transistors to switch and control the pixel electrodes, the thin film transistors being constituted by a semiconductor layer;
data lines to supply image signals to the thin film transistors;
scanning lines to supply scanning signals to the thin film transistors, the scanning lines intersecting the data lines;
an upper light shielding film to cover at least one of an upper side of channel regions and regions adjacent to the channel regions of the semiconductor layer constituting the thin film transistors; and
a lower light shielding film to cover at least one of a lower side of the channel regions and the adjacent regions, in each of the upper light shielding film and the lower light shielding film having projecting portions projected to define corner cuts in an opening region of each pixel corresponding to the pixel electrodes in the intersection regions where the data lines and the scanning lines intersect each other, the channel regions being disposed in the intersection regions, and the upper light shielding film and the lower light shielding film being connected to each other via at least one of through a light shielding conductive material and directly in the projecting portions.

2. The electro-optical device according to claim 1, the upper light shielding film and the lower light shielding film being connected to each other through contact holes, and
at least one of the upper light shielding film and plugs made of the light shielding conductive material being disposed in the contact holes.

3. The electro-optical device according to claim 1, the upper light shielding film and the lower light shielding film being connected to each other through a penetrating groove having a cross-sectional shape corresponding to a profile of the projecting portions, and a partition, which is made of at least one of the upper light shielding film and the light shielding conductive material, being formed within the penetrating groove, the partition facing the channel region from the side.

4. The electro-optical device according to claim 1, each of four corners of the intersection region being provided with the projecting portions, and the upper light shielding film and the lower light shielding film being connected to each other at each of the four corners.

5. An electro-optical device, comprising:

a substrate;

pixel electrodes formed above the substrate;

thin film transistors to switch and control the pixel electrodes, the thin film transistors being constituted by a semiconductor layer;

data lines to supply image signals to the thin film transistors;

scanning lines to supply scanning signals to the thin film transistors, the scanning lines intersecting the data lines;

an upper light shielding film to cover at least one of an upper side of channel regions and regions adjacent to the channel regions of the semiconductor layer constituting the thin film transistors; and a lower light shielding film to cover at least one of a lower side of the channel regions and the adjacent regions, each of the upper light shielding film and the lower light shielding film having projecting portions projected to define corner cuts in an opening region of each pixel corresponding to the pixel electrode, in intersection regions where the data lines and the scanning lines intersect each other, the channel regions being disposed in the intersection regions, the scanning lines being formed from the lower light shielding film, and the lower light shielding film being connected to at least one of a gate electrode film of the thin film transistors through a light shielding conductive material and connected directly to the gate electrode film of the thin film transistor, in the projecting portions.

6. The electro-optical device according to claim 5, the lower light shielding film and the gate electrode film being connected to each other through contact holes, and at least one of the gate electrode films or plugs made of the light shielding conductive material being disposed in the contact holes.

7. The electro-optical device according to claim 5, the lower light shielding film and the gate electrode film being connected to each other through a penetrating groove having a cross-sectional shape corresponding to a profile of the projecting portions, and a partition, which is made of the gate electrode film or the light shielding conductive material, being formed within the penetrating groove, the partition facing the channel region from the side.

8. The electro-optical device according to claim 5, each of four corners of the intersection region being provided with the projecting portions, and the lower light shielding film and the gate electrode film being connected to each other at each of the four corners.

9. The electro-optical device according to claim 5, the gate electrode film extending along the scanning lines and forming a part of other scanning lines constituting redundant wires of the scanning lines.

10. The electro-optical device according to claim 1, the channel region being disposed at a center of the intersection regions.

11. The electro-optical device according to claim 5, the channel region being disposed at a center of the intersection regions.

12. The electro-optical device according to claim 1, further comprising:

storage capacitors electrically connected to the pixel electrodes, the upper light shielding film functioning both as a fixed-potential-side capacitor electrode constituting the storage capacitor and a capacitor line including the fixed-potential-side capacitor electrode.

13. The electro-optical device according to claim 5, further comprising:

storage capacitors electrically connected to the pixel electrodes, the upper light shielding film functioning both as a fixed-potential-side capacitor electrode constituting the storage capacitor and a capacitor line including the fixed-potential-side capacitor electrode.

14. The electro-optical device according to claim 12, the projecting portions being formed in a plane region separated from the data lines, and the storage capacitors being also formed in a plane region overlapping the data lines.

15. The electro-optical device according to claim 13, the projecting portions being formed in a plane region separated from the data lines, and the storage capacitors being also formed in a plane region overlapping the data lines.

16. The electro-optical device according to claim 1, the projecting portions of the upper light shielding film being a little greater than the projecting portions of the lower light shielding film.

17. The electro-optical device according to claim 5, the projecting portions of the upper light shielding film being a little greater than the projecting portions of the lower light shielding film.

18. An electro-optical device, comprising:

a substrate;

pixel electrodes formed above the substrate;

thin film transistors to switch and control the pixel electrodes, the thin film transistors being constituted by a semiconductor layer;

data lines to supply image signals to the thin film transistors;

scanning lines to supply scanning signals to the thin film transistors, the scanning lines intersecting the data lines; and an upper light shielding film to cover at least one of an upper side of channel regions and regions adjacent to the channel regions of the semiconductor layer constituting the thin film transistors, and defining at least partially a lattice-shaped light shielding region along the data lines and the scanning lines, the upper light shielding film having projecting portions projected to define corner cuts in an opening region of each pixel corresponding to the pixel electrode, in intersection regions where the data lines and the scanning lines intersect each other, and the channel regions being disposed in the intersection regions.

19. The electro-optical device according to claim 18, the pixel electrode having a plane shape whose corners are cut off correspondingly to the corner cuts.

20. The electro-optical device according to claim 18, the channel regions being disposed at a center of the intersection regions.

21. The electro-optical device according to claim 18, further comprising:
storage capacitors electrically connected to the pixel electrodes,
the upper light shielding film functioning both as a fixed-potential-side capacitor electrode constituting the storage capacitor and a capacitor line including the fixed-potential-side capacitor electrode.

22. The electro-optical device according to claim 18, further comprising:
storage capacitors electrically connected to the pixel electrodes,
the storage capacitors being formed in the light shielding region and in a region overlapping the projecting portions.

23. The electro-optical device according to claim 18, further comprising:
a lower light shielding film to cover at least one of the lower side of the channel regions and the adjacent regions, and defining at least partially the lattice-shaped light shielding region.

24. The electro-optical device according to claim 23, the lower light shielding film having projecting portions projected to define the corner cuts in the intersection regions.

25. The electro-optical device according to claim 24, the plane shape of the lower light shielding film being a little smaller in the intersection regions than the plane shape of the upper light shielding film.

26. An electro-optical device, comprising:
a substrate;
pixel electrodes formed above the substrate;
thin film transistors to switch and control the pixel electrodes, the thin film transistor being constituted by a semiconductor layer;
data lines to supply image signals to the thin film transistors;
scanning lines to supply scanning signals to the thin film transistors, the scanning lines intersecting the data lines; and
a lower light shielding film to cover at least one of a lower side of channel regions and regions adjacent to the channel regions of the semiconductor layer constituting the thin film transistors, and defining at least partially a lattice-shaped light shielding region along the data lines and the scanning lines, the lower light shielding film having projecting portions projected to define corner cuts in an opening region of each pixel corresponding to the pixel electrodes, in intersection regions where the data lines and the scanning lines intersect each other, and the channel regions being disposed in the intersection regions.

27. The electro-optical device according to claim 26, the lower light shielding film, made of a light shielding conductive film, being connected to the scanning lines at a plurality of positions, extending along the scanning lines and also functioning as redundant wires of the scanning lines.

28. The electro-optical device according to claim 1, further comprising:
a counter substrate disposed opposite to the substrate, with an electro-optical material layer therebetween,
the projecting portions being provided in at least one of four corners in which operation failure in the electro-optical material layer is relatively large, among four corners of the opening region.

29. The electro-optical device according to claim 5, further comprising:
a counter substrate disposed opposite to the substrate, with an electro-optical material layer therebetween,
the projecting portions being provided in at least one of four corners in which operation failure in the electro-optical material layer is relatively large, among four corners of the opening region.

30. The electro-optical device according to claim 18, further comprising:
a counter substrate disposed opposite to the substrate, with an electro-optical material layer therebetween,
the projecting portions being provided in at least one of four corners in which operation failure in the electro-optical material layer is relatively large, among four corners of the opening region.

31. The electro-optical device according to claim 26, further comprising:
a counter substrate disposed opposite to the substrate, with an electro-optical material layer therebetween,
the projecting portions being provided in at least one of four corners in which operation failure in the electro-optical material layer is relatively large, among four corners of the opening region.

32. The electro-optical device according to claim 1, the pixel electrodes including a first pixel electrode group to be inversely driven at a first period and a second pixel electrode group to be inversely driven at a second period complementary to the first period, and being disposed in a plane on the substrate, and
the projecting portions being provided at least one of in two corners located on the first pixel electrode group side, and in two corners located on the second pixel electrode group side from a center of the intersection region.

33. The electro-optical device according to claim 5, the pixel electrodes including a first pixel electrode group to be inversely driven at a first period and a second pixel electrode group to be inversely driven at a second period complementary to the first period, and being disposed in a plane on the substrate, and
the projecting portions being provided at least one of in two corners located on the first pixel electrode group side, and in two corners located on the second pixel electrode group side from a center of the intersection region.

34. The electro-optical device according to claim 18, the pixel electrodes including a first pixel electrode group to be inversely driven at a first period and a second pixel electrode group to be inversely driven at a second period complementary to the first period, and being disposed in a plane on the substrate, and
the projecting portions being provided at least one of in two corners located on the first pixel electrode group side, and in two corners located on the second pixel electrode group side from a center of the intersection region.

35. The electro-optical device according to claim 26, the pixel electrodes including a first pixel electrode group to be inversely driven at a first period and a second pixel electrode group to be inversely driven at a second period complementary to the first period, and being disposed in a plane on the substrate, and
the projecting portions being provided at least one of in two corners located on the first pixel electrode group side, and in two corners located on the second pixel electrode group side from a center of the intersection region.

36. The electro-optical device according to claim 1, each of four corners of the opening region being provided with projecting portions symmetrical in the horizontal and the vertical direction.

37. The electro-optical device according to claim 5, each of four corners of the opening region being provided with projecting portions symmetrical in the horizontal and the vertical direction.

38. The electro-optical device according to claim 18, each of four corners of the opening region being provided with projecting portions symmetrical in the horizontal and the vertical direction.

39. The electro-optical device according to claim 26, each of four corners of the opening region being provided with projecting portions symmetrical in the horizontal and the vertical direction.

40. The electro-optical device according to claim 1, further comprising:
micro lenses disposed opposite to the pixel electrodes, at least one of on the substrate and on a counter substrate disposed opposite to the substrate.

41. The electro-optical device according to claim 5, further comprising:
micro lenses disposed opposite to the pixel electrodes, at least one of on the substrate and on a counter substrate disposed opposite to the substrate.

42. The electro-optical device according to claim 18, further comprising:
micro lenses disposed opposite to the pixel electrodes, at least one of on the substrate and on a counter substrate disposed opposite to the substrate.

43. The electro-optical device according to claim 26, further comprising:
micro lenses disposed opposite to the pixel electrodes, at least one of on the substrate and on a counter substrate disposed opposite to the substrate.

44. The electro-optical device according to claim 1, the upper light shielding film defining at least partially a lattice-shaped light shielding region along the data lines and the scanning lines.

45. The electro-optical device according to claim 5, the upper light shielding film defining at least partially a lattice-shaped light shielding region along the data lines and the scanning lines.

46. The electro-optical device according to claim 18, a drain electrode of the thin film transistors being disposed in a region overlapping the projecting portions as viewed in plan view.

47. The electro-optical device according to claim 26, a drain electrode of the thin film transistors being disposed in a region overlapping the projecting portions as viewed in plan view.

48. An electronic apparatus, comprising:
an electro-optical device that includes:
a substrate;
pixel electrodes formed above the substrate;
thin film transistors to switch and control the pixel electrodes, the thin film transistors being constituted by a semiconductor layer;
data lines to supply image signals to the thin film transistors;
scanning lines to supply scanning signals to the thin film transistors, the scanning lines intersecting the data lines;
an upper light shielding film to cover at least one of an upper side of channel regions and regions adjacent to the channel region of the semiconductor layer constituting the thin film transistors; and
a lower light shielding film to cover at least one of a lower side of the channel regions and the adjacent regions, in each of the upper light shielding film and the lower light shielding film having projecting portions projected to define corner cuts in an opening region of each pixel corresponding to the pixel electrodes, in intersection regions where the data lines and the scanning lines intersect each other, the channel regions being disposed in the intersection regions, and the upper light shielding film and the lower light shielding film being connected to each other at least one of through a light shielding conductive material and directly in the projecting portions.

49. An electronic apparatus, comprising:
an electro-optical device that includes:
a substrate;
pixel electrodes formed above the substrate;
thin film transistors to switch and control the pixel electrodes, the thin film transistors being constituted by a semiconductor layer;
data lines to supply image signals to the thin film transistors;
scanning lines to supply scanning signals to the thin film transistors, the scanning lines intersecting the data lines;
an upper light shielding film to cover at least one of an upper side of channel regions and regions adjacent to the channel regions of the semiconductor layer constituting the thin film transistors; and
a lower light shielding film to cover the lower side of the channel regions and/or the adjacent regions, in each of the upper light shielding film and the lower light shielding film having projecting portions projected to define corner cuts in an opening region of each pixel corresponding to the pixel electrodes, in intersection regions where the data lines and the scanning lines intersect each other, the channel regions being disposed in the intersection regions, the scanning lines being formed from the lower light shielding film, and the lower light shielding film being connected to at least one of a gate electrode film of the thin film transistors through a light shielding conductive material and directly connected to the gate electrode film of the thin film transistors in the projecting portions.

50. An electronic apparatus, comprising:
electro-optical device that includes:
a substrate;
pixel electrodes formed above the substrate;
thin film transistors to switch and control the pixel electrodes, the thin film transistors being constituted by a semiconductor layer;
data lines to supply image signals to the thin film transistors;
scanning lines to supply scanning signals to the thin film transistors, the scanning lines intersecting the data lines; and
an upper light shielding film to cover at least one of a upper side of channel regions and regions adjacent to the channel regions of the semiconductor layer constituting the thin film transistors, and defining at least partially a lattice-shaped light shielding region along the data lines and the scanning lines, in the upper light shielding film having projecting portions projected to define corner cuts in an opening region of each pixel corresponding to the pixel electrodes, in intersection regions where the data lines and the scanning lines intersect each other, and the channel regions being disposed in the intersection region.

51. An electronic apparatus, comprising:
an electro-optical device that includes:
  a substrate;
  pixel electrodes formed above the substrate;
  thin film transistors to switch and control the pixel electrodes, the thin film transistors being constituted by a semiconductor layer;
  data lines to supply image signals to the thin film transistors;
  scanning lines to supply scanning signals to the thin film transistors, the scanning lines intersecting the data lines; and
  a lower light shielding film to cover at least one of a lower side of channel regions and regions adjacent to the channel regions of the semiconductor layer constituting the thin film transistors, and defining at least partially a lattice-shaped light shielding region along the data lines and the scanning lines, the lower light shielding film having projecting portions projected to define corner cuts in an opening region of each pixel corresponding to the pixel electrode, in the intersection regions where the data lines and the scanning lines intersect each other, and the channel regions being disposed in the intersection regions.

* * * * *